US 11,101,186 B2

(12) United States Patent
Ho et al.

(10) Patent No.: US 11,101,186 B2
(45) Date of Patent: Aug. 24, 2021

(54) SUBSTRATE STRUCTURE HAVING PAD PORTIONS

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/297,451

(22) Filed: Mar. 8, 2019

(65) Prior Publication Data

US 2019/0287867 A1    Sep. 19, 2019

Related U.S. Application Data

(60) Provisional application No. 62/644,200, filed on Mar. 16, 2018.

(51) Int. Cl.
| | |
|---|---|
| *H01L 27/32* | (2006.01) |
| *H01L 23/31* | (2006.01) |
| *H01L 23/498* | (2006.01) |
| *H01L 21/66* | (2006.01) |
| *H01L 23/00* | (2006.01) |
| *H01L 21/48* | (2006.01) |
| *H01L 21/56* | (2006.01) |

(52) U.S. Cl.
CPC .......... *H01L 22/32* (2013.01); *H01L 21/4853* (2013.01); *H01L 21/4857* (2013.01); *H01L 21/563* (2013.01); *H01L 21/565* (2013.01); *H01L 22/12* (2013.01); *H01L 23/3128* (2013.01); *H01L 23/49822* (2013.01); *H01L 23/49838* (2013.01); *H01L 24/16* (2013.01); *H01L 27/32* (2013.01); *H01L 2224/16227* (2013.01)

(58) Field of Classification Search
CPC ..... H01L 27/32; H01L 22/12; H01L 23/3128; H01L 23/49822; H01L 23/49838; H01L 24/16

See application file for complete search history.

(56) References Cited

U.S. PATENT DOCUMENTS

| | | | |
|---|---|---|---|
| 7,307,852 B2* | 12/2007 | Inagaki | H01L 23/645 361/760 |
| 8,334,174 B2* | 12/2012 | Chang | H01L 21/568 438/118 |
| 8,344,749 B2 | 1/2013 | Stillman et al. | |

(Continued)

*Primary Examiner* — Ida M Soward
(74) *Attorney, Agent, or Firm* — Foley & Lardner LLP

(57) ABSTRACT

A substrate structure includes a wiring structure and a supporter. The wiring structure includes a first dielectric structure, a first circuit layer, a second dielectric structure and a second circuit layer. The first circuit layer is disposed on the first dielectric structure. The second dielectric structure covers the first dielectric structure and the first circuit layer. A pad portion of the first circuit layer is exposed from the first dielectric structure, and the second circuit layer protrudes from the second dielectric structure. The supporter is disposed adjacent to the first dielectric structure of the wiring structure, and defines at least one through hole corresponding to the exposed pad portion of the first circuit layer.

14 Claims, 19 Drawing Sheets

(56) References Cited

U.S. PATENT DOCUMENTS

| | | | |
|---|---|---|---|
| 8,455,766 B2* | 6/2013 | Tanaka | H01L 23/147 174/255 |
| 9,136,220 B2* | 9/2015 | Uchiyama | H01L 23/49822 |
| 9,171,790 B2* | 10/2015 | Yu | H01L 24/17 |
| 9,583,247 B2 | 2/2017 | David et al. | |
| 2011/0063806 A1* | 3/2011 | Kariya | H01L 23/49822 361/748 |
| 2012/0208322 A1* | 8/2012 | Okada | H01L 25/105 438/118 |
| 2019/0006339 A1* | 1/2019 | Lau | H01L 25/105 |
| 2019/0027454 A1* | 1/2019 | Chen | H01L 25/0652 |
| 2020/0035584 A1* | 1/2020 | Chen | H01L 23/528 |
| 2020/0066643 A1* | 2/2020 | Yu | H01L 25/0655 |

* cited by examiner

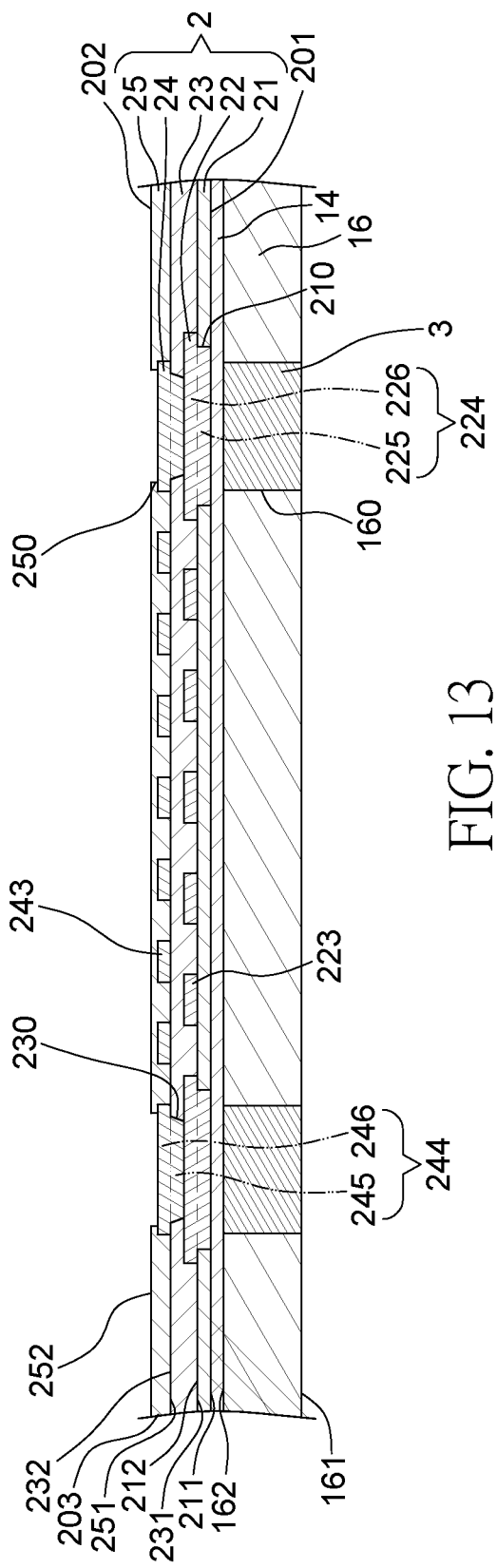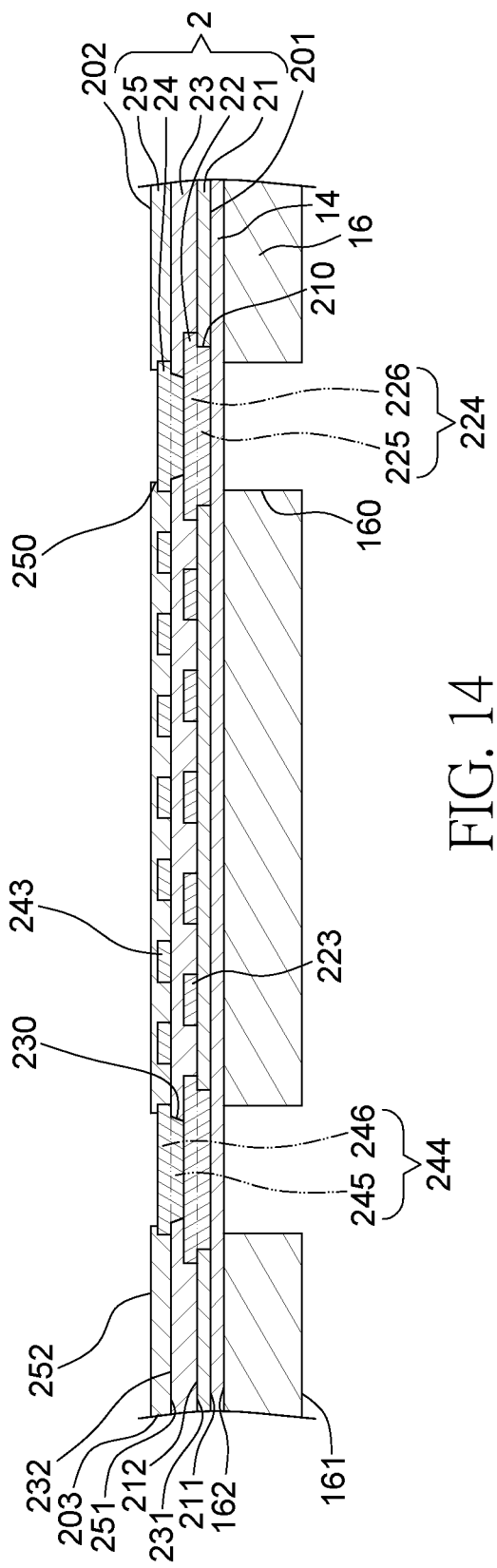

SUBSTRATE STRUCTURE HAVING PAD PORTIONS

CROSS-REFERENCE TO RELATED APPLICATIONS

This application claims the benefit of and priority to U.S. Provisional Patent Application No. 62/644,200, filed on Mar. 16, 2018, which is incorporated herein by reference in its entirety.

BACKGROUND

1. Field of the Disclosure

The present disclosure relates to a substrate structure, a semiconductor package structure and a semiconductor process, and to a coreless substrate structure, a semiconductor package structure, and a semiconductor process for forming or testing the substrate structure.

2. Description of the Related Art

In a manufacturing process for forming a package structure, a wiring structure including a plurality of circuit layers and dielectric layers is firstly formed on a carrier. Then, a semiconductor die is attached and electrically connected to the wiring structure. However, since a lower surface of the wiring structure is covered by the carrier, a probe cannot reach a bottommost circuit layer of the wiring structure. Accordingly, electrical connection defect (e.g., open circuit) between the topmost circuit layer and the bottommost circuit layer cannot be tested.

SUMMARY

In some embodiments, a substrate structure includes a wiring structure and a supporter. The wiring structure includes a first dielectric structure, a first circuit layer, a second dielectric structure and a second circuit layer. The first circuit layer is disposed on the first dielectric structure. The second dielectric structure covers the first dielectric structure and the first circuit layer. A pad portion of the first circuit layer is exposed from the first dielectric structure, and the second circuit layer protrudes from the second dielectric structure. The supporter is disposed adjacent to the first dielectric structure of the wiring structure, and defines at least one through hole corresponding to the exposed pad portion of the first circuit layer.

In some embodiments, a semiconductor package structure includes a wiring structure, a supporter, a semiconductor die and an encapsulant. The wiring structure has a first surface and a second surface opposite to the first surface, and includes at least one dielectric structure and at least one circuit layer. A pad portion of the circuit layer is exposed from the first surface. The supporter is disposed adjacent to the first surface of the wiring structure and defining at least one through hole corresponding to the exposed pad portion of the circuit layer. The semiconductor die is electrically connected to the second surface of the wiring structure. The encapsulant covers the semiconductor die and the second surface of the wiring structure.

In some embodiments, a semiconductor process includes: (a) providing a supporter defining at least one through hole; (b) forming or disposing a plugging material in the through hole of the supporter; and (c) forming a wiring structure on the supporter, wherein the wiring structure has a first surface and a second surface opposite to the first surface, and includes at least one dielectric structure and at least one circuit layer, a pad portion of the circuit layer is exposed from the first surface, the first surface faces the supporter, and the through hole of the supporter corresponds to the exposed pad portion of the circuit layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 13 illustrates one or more stages of an example of a semiconductor process according to some embodiments of the present disclosure.

FIG. 14 illustrates one or more stages of an example of a semiconductor process according to some embodiments of the present disclosure.

DETAILED DESCRIPTION

Figure 1:
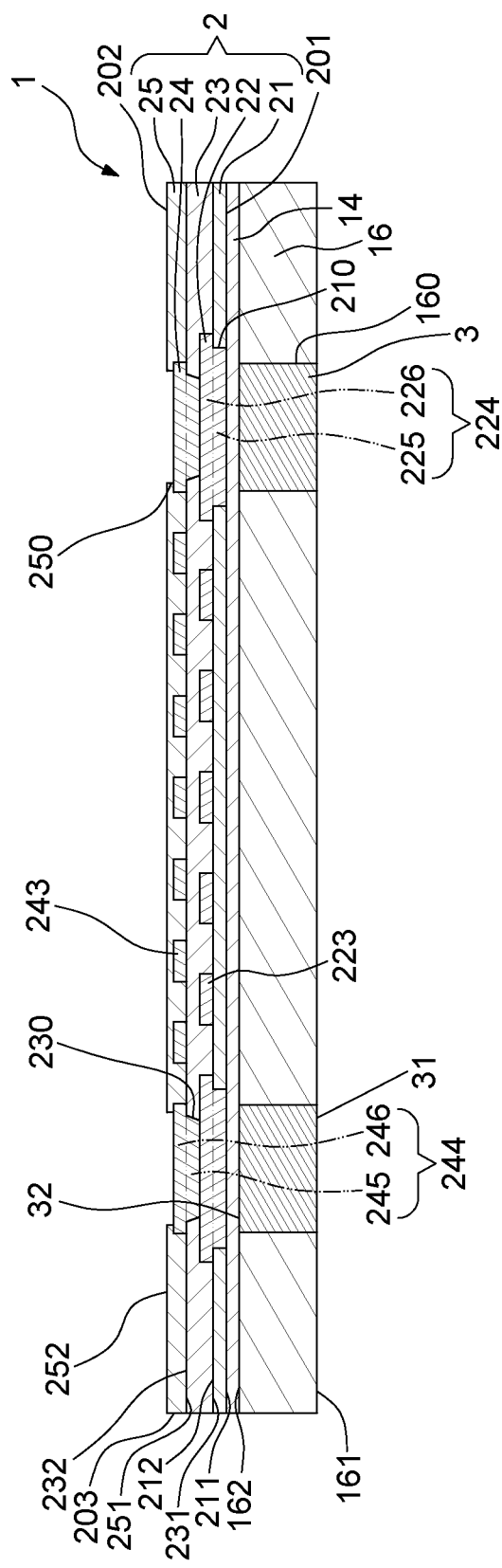
FIG. 1 illustrates a cross sectional view of an example of a substrate structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a manufacturing process of a semiconductor package structure, a wiring structure is firstly formed on a carrier by stacking a plurality of circuit layers and dielectric layers. Then, a semiconductor die is attached and electrically connected to a portion of a topmost circuit layer of the wiring structure. An encapsulant is then formed on the wiring structure to cover the semiconductor die. Then, the supporter is removed to expose a portion of a bottommost circuit layer of the wiring structure, and a singulation process is conducted to the encapsulant and the wiring structure to form the semiconductor package structure.

Before attaching the semiconductor die to the wiring structure, an auto optical inspection may be conducted to an upper surface of the wiring structure. The auto optical inspection is for testing the integrity of a topmost circuit layer of the wiring structure. However, since a lower surface of the wiring structure is covered by the carrier, a probe cannot reach a bottommost circuit layer of the wiring structure. Accordingly, electrical connection defect (e.g., open circuit) between the topmost circuit layer and the bottommost circuit layer cannot be tested before attaching the semiconductor die and removing the supporter. Hence, if the wiring structure has such electrical connection defect, the semiconductor die attached thereon is wasted.

In a comparative process, a through hole is formed on and extends through the supporter to expose the bottommost circuit layer of the wiring structure, such that the probe is able to reach the bottommost circuit layer of the wiring structure before removal of the supporter. The through hole may be formed by laser or mechanical drilling. However, since the supporter is generally made of a stiff material, such as glass, a power of the laser or mechanical drilling process is relatively high, thus may damage the wiring structure.

Hence, at least some embodiments of the present disclosure provide for a substrate structure, which includes a wiring structure disposed on a supporter defining a through hole. The wiring structure can be tested before removal of the supporter. At least some embodiments of the present disclosure further provide for a semiconductor package structure including the substrate structure, and a semiconductor process for forming and/or testing the substrate structure FIG. 1 illustrates a cross sectional view of a substrate structure 1 according to some embodiments of the present disclosure. The substrate structure 1 may include a wiring structure 2, an insulation layer 14, a supporter 16, and a plugging material 3.

The wiring structure 2 has a first surface 201, a second surface 202 opposite to the first surface 201, and a lateral surface 203 extending between the first surface 201 and the second surface 202. The wiring structure 2 includes at least one dielectric structure (e.g., a first dielectric structure 21, a second dielectric structure 23 and a third dielectric structure 25) and at least one circuit layer (e.g., a first circuit layer 22 and a second circuit layer 24). For example, as shown in FIG. 1, the wiring structure 2 includes a first dielectric structure 21, a first circuit layer 22, a second dielectric structure 23, a second circuit layer 24 and a third dielectric structure 25.

The first dielectric structure 21 has a first surface 211 and a second surface 212 opposite the first surface 211. The first surface 211 of the first dielectric structure 21 may be a portion of the first surface 201 of the wiring structure 2. The first dielectric structure 21 defines at least one through hole 210. As shown in FIG. 1, the first dielectric structure 21 defines two through holes 210. The first dielectric structure 21 may include, or be formed from, a cured PID material such as epoxy or polyimide (PI) including photoinitiators.

The first circuit layer 22 is disposed on the second surface 212 of the first dielectric structure 21. The first circuit layer 22 includes a plurality of first conductive traces 223 and at least one first pad portion 224. The first pad portion 224 may include a lower portion 225 and an upper portion 226. The traces 223, the lower portion 225 and the upper portion 226 of the first pad portion 224 may be formed concurrently and integrally. However, in other embodiments, the traces 223 and the upper portion 226 of the first pad portion 224 may be formed concurrently and integrally, while the lower portion 225 of the first pad portion 224 is separately formed, and a boundary may exist between the lower portion 225 and the upper portion 226 of the first pad portion 224. The lower portion 225 of the first pad portion 224 is disposed in the through hole 210 of the first dielectric structure 21, and is exposed from the first surface 211 of the first dielectric structure 21. That is, a pad portion (e.g., the first pad portion 224) of the circuit layer (e.g., the first circuit layer 22) is exposed from the first surface 201 of the wiring structure 21. The first circuit layer 22 may be a redistribution layer. A line width/line space (L/S) of the first circuit layer 22 may be less than about 7 µm/about 7 µm (e.g., in a range of about 2 µm/about 2 µm to about 5 µm/about 5 µm). In some embodiments, the first circuit layer 22 may be a bottommost circuit layer of the wiring structure 2.

The second dielectric structure 23 is disposed on and covers the first dielectric structure 21 and the first circuit layer 22. The second dielectric structure 23 has a first surface 231 and a second surface 232 opposite to the first surface 231. For example, the first surface 231 of the second dielectric structure 23 contacts the second surface 212 of the first dielectric structure 21. The second dielectric structure 23 defines at least one through hole 230 to expose the upper portion 226 of the first pad portion 224 of the first circuit layer 22. The second dielectric structure 23 may include, or be formed from, a cured PID material such as epoxy or polyimide (PI) including photoinitiators.

The second circuit layer 24 protrudes from the second dielectric structure 23. The second circuit layer 24 is disposed on the second surface 232 of the second dielectric structure 23. The second circuit layer 24 includes a plurality of second conductive traces 243 and at least one second pad portion 244. A bottom surface of the second conductive trace 243 of the second circuit layer 24 may be disposed on or stand on the second surface 232 of the second dielectric structure 23. That is, the second conductive trace 243 of the second circuit layer 24 may be not embedded in the second dielectric structure 23. The second pad portion 244 may include a lower portion 245 and an upper portion 246. The traces 243, the lower portion 245 and the upper portion 246 of the second pad portion 244 may be formed concurrently and integrally. However, in other embodiments, the traces 223 and the upper portion 246 of the second pad portion 244 may be formed concurrently and integrally, while the lower portion 245 of the second pad portion 244 is separately formed, and a boundary may exist between the lower portion 245 and the upper portion 246 of the second pad portion 244. The lower portion 245 of the second pad portion 244 is disposed in the through hole 230 of the second dielectric structure 23 to contact the first pad portion 224 of the first circuit layer 22, such as the upper portion 226 of the first pad portion 224 of the first circuit layer 22. The second circuit layer 24 may be a redistribution layer. A line width/line space (L/S) of the second circuit layer 24 may be less than about 7 µm/about 7 µm (e.g., in a range of about 2 µm/about 2 µm to about 5 µm/about 5 µm). In one embodiment, the line width/line space (L/S) of the second circuit layer 24 may be less than the line width/line space (L/S) of the first circuit layer 22. In some embodiments, the second circuit layer 24 may be a topmost circuit layer of the wiring structure 2. There may be more than one circuit layer and dielectric structure disposed between the second circuit layer 24 and the first circuit layer 22.

The third dielectric structure 25 is disposed on and covers the second dielectric structure 23 and the second circuit layer 24. The third dielectric structure 25 has a first surface 251 and a second surface 252 opposite to the first surface 251. For example, the first surface 251 of the third dielectric structure 25 contacts the second surface 232 of the second dielectric structure 23. The second surface 252 of the third dielectric structure 25 may be a portion of the second surface 202 of the wiring structure 2. The third dielectric structure 25 defines at least one through hole 250 to expose the upper portion 246 of the second pad portion 244 of the second circuit layer 24. The third dielectric structure 25 may include, or be formed from, a cured PID material such as epoxy or polyimide (PI) including photoinitiators.

The insulation layer 14 is disposed on the first surface 201 of the wiring structure 2. As shown in FIG. 1, the insulation layer 14 covers the entire first surface 201 of the wiring structure 2. For example, the insulation layer 14 covers the first surface 211 of the first dielectric structure 21, and the exposed pad portion 224 of the first circuit layer 22. The insulation layer 14 may be made of a dielectric material, or may be a releasing film.

Figure 5:
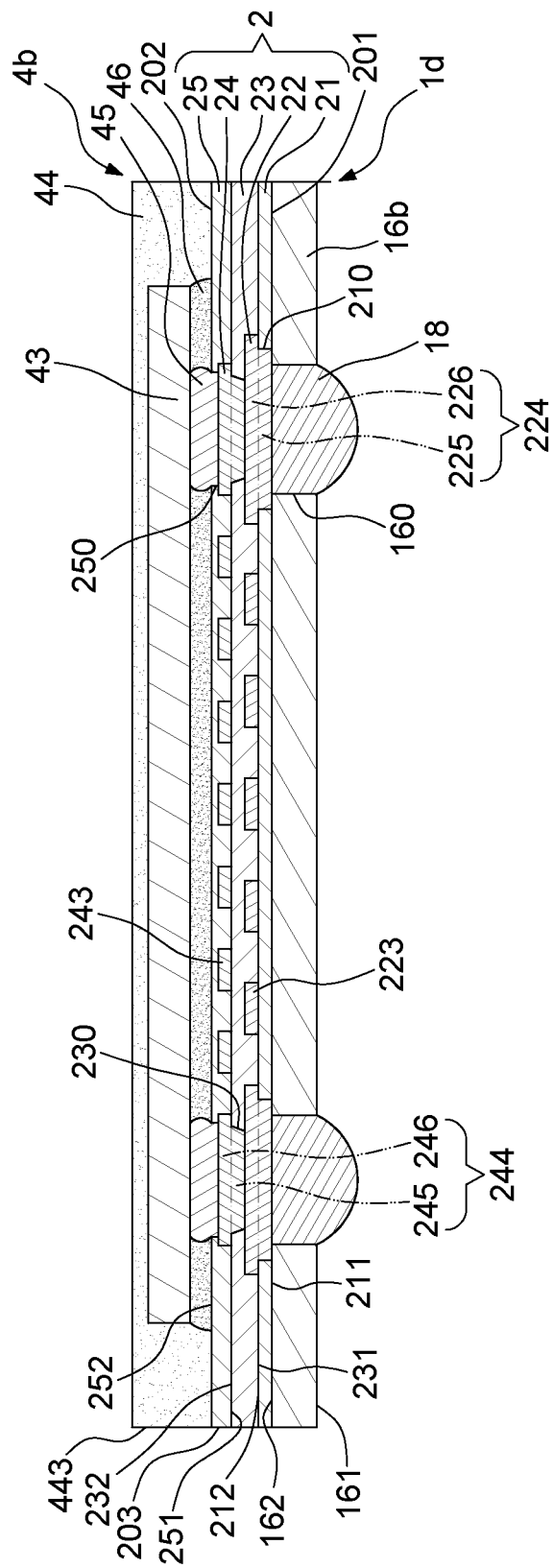
FIG. 5 illustrates a cross sectional view of an example of a semiconductor package structure according to some embodiments of the present disclosure.

The supporter 16 is disposed adjacent to the first surface 201 of the wiring structure 2. For example, the supporter 16 may be disposed on the insulation layer 14 on the first surface 201 of the wiring structure 2. That is, the insulation layer 14 is disposed between the wiring structure 2 and the supporter 16. However, in other embodiments, the insulation layer 14 may be omitted, and the supporter 16 may be directly disposed on and contact the wiring structure 2 (as shown in FIG. 5). The supporter 16 has a first surface 161 and a second surface 162 opposite to the first surface 161. The second surface 162 faces the wiring structure 2. The supporter 16 defines at least one through hole 160 corresponding to the exposed pad portion (e.g., the first pad portion 224) of the circuit layer (e.g., the first circuit layer 22). The through hole 160 extends through the supporter 16 and extends between the first surface 161 and second surface 162. The through hole 160 may have a consistent width from the first surface 161 to the second surface 162. A material of the supporter may be organic (e.g., core, epoxy, compound) or inorganic (e.g., Si, glass, metal). In some embodiments, a Young's modulus of the supporter 16 may be about 70 GPa (such as glass) to about 200 GPa (such as stainless steel), which is greater than that of the wiring structure 2. Accordingly, the supporter 16 is solid and can be used to support the wiring structure 2 during a manufacturing process thereof. For example, the supporter 16 may be a portion of a carrier which is generally used for forming the wiring structure 2 thereon.

The plugging material 3 is disposed in the through hole 160 of the supporter 16. The plugging material 3 blocks the through hole 160 of the supporter 16, such that the first surface 161 of the supporter 16 is not in communication with the second surface 162 through the through hole 16. For example, as shown in FIG. 1, the plugging material 3 fills the through hole 160 of the supporter 16. The plugging material 3 may have a first surface 31 and a second surface 32 opposite to the first surface 31. The first surface 31 of the plugging material 3 is substantially coplanar with the first surface 161 of the supporter 16, and the second surface 32 of the plugging material 3 is substantially coplanar with the second surface 162 of the supporter 16. That is, two opposite surfaces (e.g., the first surface 31 and the second surface 32) of the plugging material 3 are respectively coplanar with two opposite surfaces (e.g., the first surface 161 and the second surface 162) of the supporter 16. The material of the plugging material 3 may be a resin, such as epoxy (e.g., PHP-900 IR6 produced by SAN-EI KAGAKU CO., LTD) or other suitable material. Accordingly, the plugging material 3 may be removed by dissolving with a solvent (e.g., a solution of potassium manganate(VII) or sodium manganate (VII)) or by laser drilling with a lower power.

Figure 16:
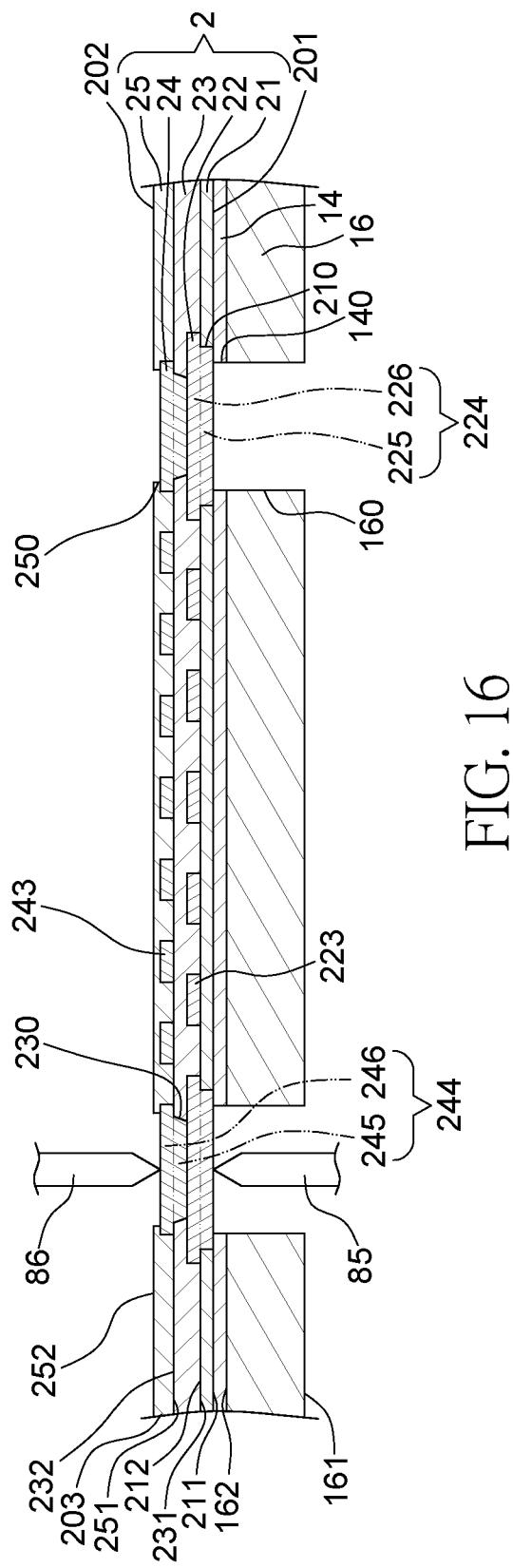
FIG. 16 illustrates one or more stages of an example of a semiconductor process according to some embodiments of the present disclosure.

Since the supporter 16 defines the through hole 160, a testing stage (e.g., open/short (O/S) testing) may be conducted to test the wiring structure 2 before attaching a semiconductor die to the wiring structure 2 and/or removing the supporter 16. That is, the plugging material 3 can easily be removed by dissolving with a solvent or by laser drilling with a lower power, which may not damage the wiring structure 2. Then, a probe may extend through the supporter 16 to contact the exposed pad portion (e.g., the first pad portion 224) of the circuit layer (e.g., the first circuit layer 22), as shown in FIG. 16.

During the formation of the wiring structure 2, the plugging material 3 blocks the through hole 160 of the supporter 16, thus protecting the wiring structure 2 from contacting reagents (e.g., developer or etching reagent) flow into the through hole 160 of the supporter 16. Besides, the plugging material 3 may serve as a target for precisely locating the circuit layer (e.g., the first circuit layer 22) of the wiring structure 2.

Figure 2:
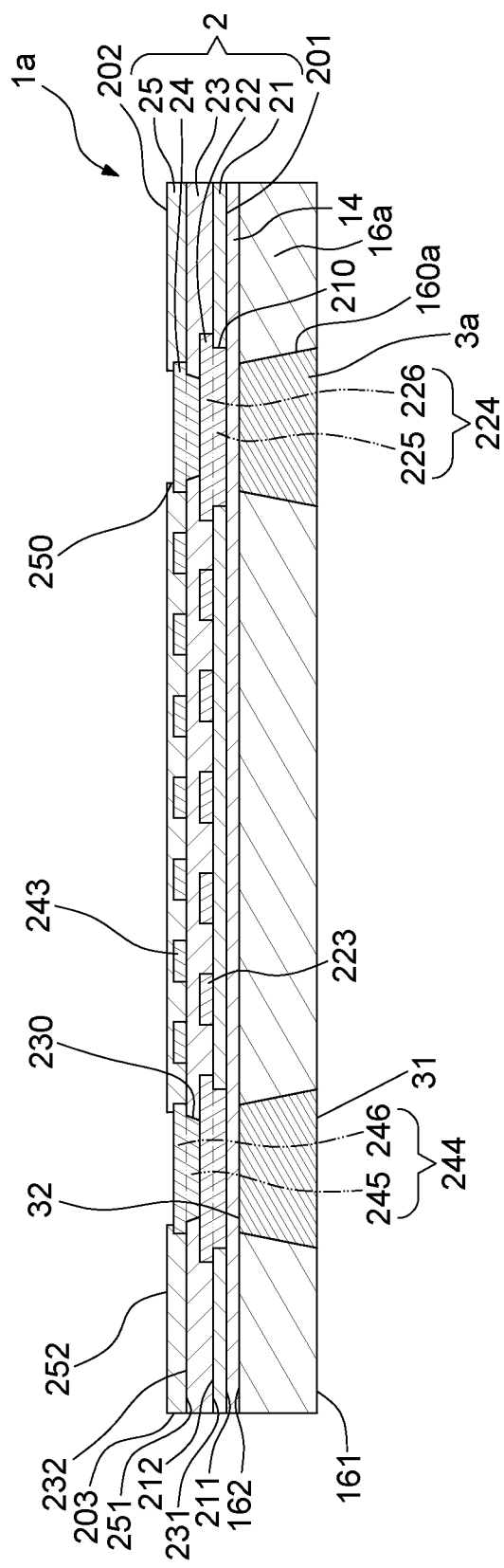
FIG. 2 illustrates a cross sectional view of an example of a substrate structure according to some embodiments of the present disclosure.

FIG. 2 illustrates a cross sectional view of an example of a substrate structure 1a according to some embodiments of the present disclosure. The substrate structure 1a is similar to the substrate structure 1 shown in FIG. 1, except for the shape of the through hole 160a of the supporter 16a and the shape of the plugging material 3a.

As can be seen in FIG. 2, the through hole 160a of the supporter 16a tapers toward the wiring structure 2. For example, the through hole 160a of the supporter 16a tapers from the first surface 161 of the supporter 16a toward the second surface 162 of the supporter 16a. The through hole 160a of the supporter 16a is substantially in a trapezoid shape. Accordingly, the plugging material 3a is substantially in a trapezoid shape. In other embodiments, the through hole 160a of the supporter 16a may taper from the second surface 162 of the supporter 16a toward the first surface 161 of the supporter 16a. In other embodiments, the through hole 160a of the supporter 16a may be in other shapes, such as a bow tie shape.

Figure 3:
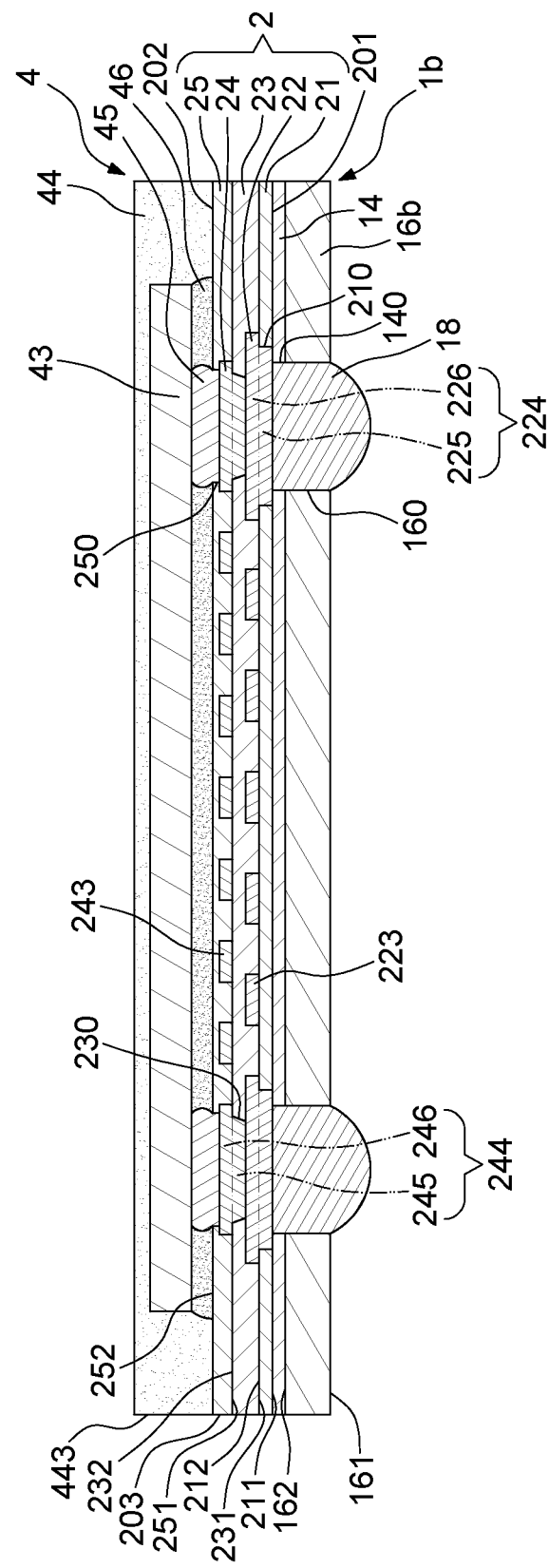
FIG. 3 illustrates a cross sectional view of an example of a semiconductor package structure according to some embodiments of the present disclosure.

FIG. 3 illustrates a cross sectional view of an example of a semiconductor package structure 4 according to some embodiments of the present disclosure. The semiconductor package structure 4 includes a substrate structure 1b (including a wiring structure 2, a supporter 16b and a connecting element 18), a semiconductor die 43, a first solder ball 45, a first underfill 46 and an encapsulant 44.

The substrate structure 1b is similar to the substrate structure 1 shown in FIG. 1, except for the follows. For example, as shown in FIG. 3, the plugging material 3 in FIG. 1 can be omitted, and the insulation layer 14 defines a through hole 140. The through hole 140 of the insulation layer 14 corresponds to the through hole 160 of the supporter 16b to expose the pad portion (e.g., the first pad portion 224) of the circuit layer (e.g., the first circuit layer 22). For example, as shown in FIG. 3, a width of the through hole 140 of the insulation layer 14 is the same as the width of the through hole 160 of the supporter 16b. A sidewall of the through hole 140 of the insulation layer 14 is continuous with a sidewall of the through hole 160 of the supporter 16b. In addition, a thickness of the supporter 16b shown in FIG. 3 is less than a thickness of the supporter 16 shown in FIG. 1. However, in other embodiments, the thickness of the supporter 16b shown in FIG. 3 may be substantially the same as the thickness of the supporter 16 shown in FIG. 1.

The connecting element 18 is disposed in the through hole 140 of the insulation layer 14 and in the through hole 160 of the supporter 16b for external connection purpose. The connecting element 18 contacts the exposed pad portion (e.g., the first pad portion 224) of the circuit layer (e.g., the first circuit layer 22). The connecting element 18 may be a solder ball, a copper pillar, or a copper pillar having a solder cap.

The semiconductor die 43 is electrically connected to the second surface 202 of the wiring structure 2. For example, the semiconductor die 43 is electrically connected to the upper portion 246 of the second pad portion 244 of second circuit layer 24 through the first solder ball 45 disposed therebetween. As shown in FIG. 3, the semiconductor die 43 is attached to the second surface 202 of the wiring structure 2 by flip-chip bonding.

The underfill 46 is disposed between the semiconductor die 43 and the second surface 202 of the wiring structure 2, and surrounds the first solder ball 45. The encapsulant 44 covers the semiconductor die 43 and the second surface 202 of the wiring structure 2. For example, the encapsulant 44 is disposed on the second surface 202 of the wiring structure 2 and encapsulates the semiconductor die 43. A lateral surface 443 of the encapsulant 44 may be substantially coplanar with the lateral surface 203 of the wiring structure 2. The encapsulant 44 may be made of a molding compound with or without fillers. In some embodiments, the first underfill 46 may be omitted, and the encapsulant 44 may further be disposed between the semiconductor die 43 and the second surface 202 of the wiring structure 2.

In the semiconductor package structure 4, the wiring structure 2 may be tested before attaching the semiconductor die 43. That is, the wiring structure 2 is known-good. Accordingly, the semiconductor package structure 4 is provided with improved yield rate. Besides, the supporter 16b may support the wiring structure 2 disposed thereon, thus reducing warpage of the wiring structure 2 during the manufacturing process of the semiconductor package structure 4 (e.g., the stages for attaching the semiconductor die 43 or forming the encapsulant 44 on the wiring structure 2).

Figure 4:
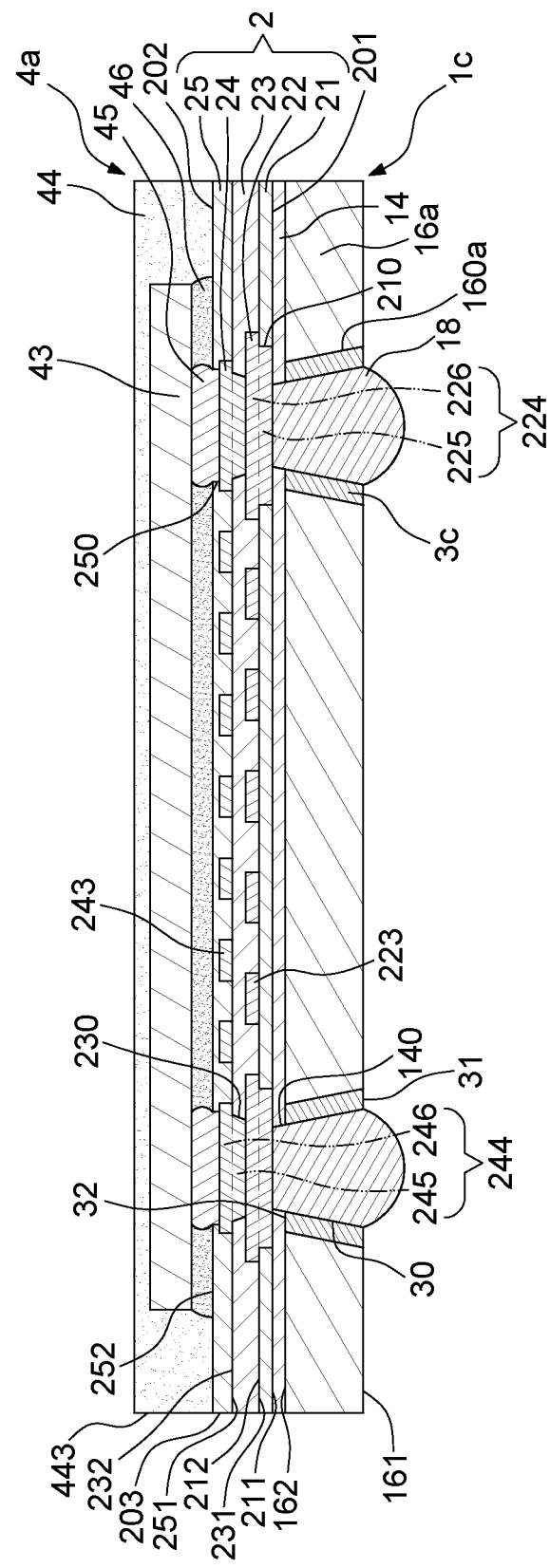
FIG. 4 illustrates a cross sectional view of an example of a semiconductor package structure according to some embodiments of the present disclosure.

FIG. 4 illustrates a cross sectional view of an example of a semiconductor package structure 4a according to some embodiments of the present disclosure. The semiconductor package structure 4a is similar to the semiconductor package structure 4 shown in FIG. 3, except for the substrate structure 1c.

The supporter 16a shown in FIG. 4 is similar to the supporter 16a shown in FIG. 2. That is, the through hole 160a of the supporter 16a is substantially in a trapezoid shape. Besides, the substrate structure 1c further include a plugging material 3c disposed in the through hole 160a of the supporter 16a. The plugging material 3c defines a through hole 30 to expose the pad portion (e.g., the first pad portion 224) of the circuit layer (e.g., the first circuit layer 22). A sidewall of the through hole 30 of the plugging material 3c is continuous with a sidewall of the through hole 140 of the insulation layer 14. The connecting element 18 is disposed in the through hole 30 of the plugging material 3c and contacts the pad portion (e.g., the first pad portion 224) of the circuit layer (e.g., the first circuit layer 22). A thickness of the supporter 16a shown in FIG. 4 is substantially the same as the supporter 16a shown in FIG. 2. However, in other embodiments, the supporter 16a shown in FIG. 4 may have a smaller thickness than the supporter 16a shown in FIG. 2.

FIG. 5 illustrates a cross sectional view of an example of a semiconductor package structure 4b according to some embodiments of the present disclosure. The semiconductor package structure 4b is similar to the semiconductor package structure 4 shown in FIG. 3, except that the insulation layer 14 is omitted. Accordingly, the supporter 16 is directly disposed on and contacts the wiring structure 2.

Figure 6:
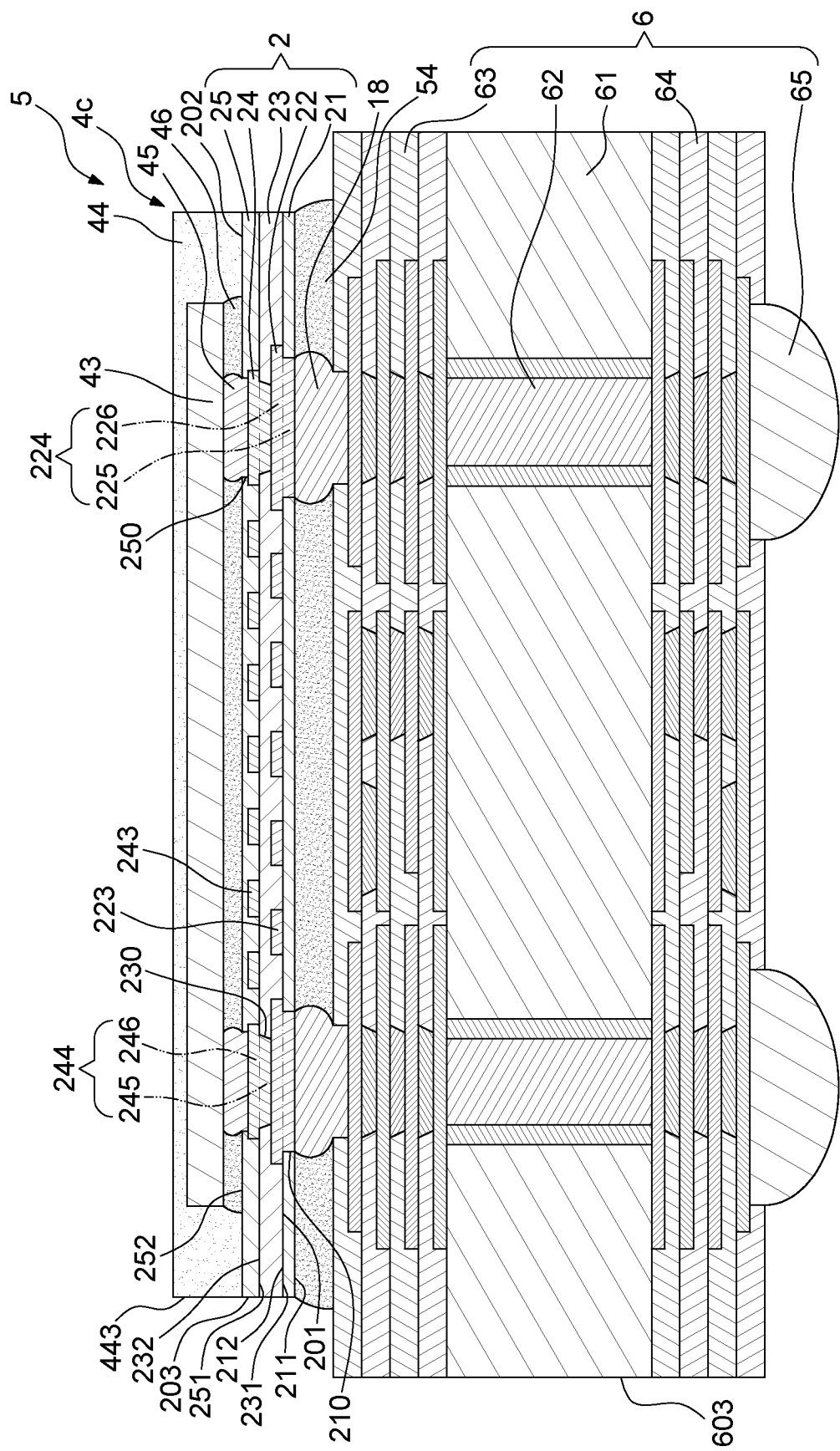
FIG. 6 illustrates a cross sectional view of an example of a semiconductor device according to some embodiments of the present disclosure.

FIG. 6 illustrates a cross sectional view of an example of a semiconductor device 5 according to some embodiments of the present disclosure. The semiconductor device 5 includes a semiconductor package structure 4c, a package substrate 6, and a second underfill 54.

The package substrate 6 includes a core 61, a conductive via 62, a top redistribution layer (RDL) 63, a bottom RDL 64, and a second solder ball 65. The conductive via 62 extends through the core 61. The conductive via 62 may include a conductive material surrounded by an insulation material. The top RDL 63 and the bottom RDL 64 are respectively disposed on two opposite surfaces of the core 61, and are electrically connected to each other through the conductive via 62. The top RDL 63 and the bottom RDL 64 may respectively include one or more redistribution layers. For example, the top RDL 63 may include a first dielectric layer, a first circuit layer, a second dielectric layer, a second circuit layer, a third dielectric layer, a third circuit layer and a fourth dielectric layer sequentially disposed on the top surface of the core 61. Each of the first circuit layer, the second circuit layer and the third circuit layer may include at least one trace and at least one via. The first circuit layer, the second circuit layer and the third circuit layer may be electrically connected to each other. Similarly, the bottom RDL 64 may also include a first dielectric layer, a first circuit layer, a second dielectric layer, a second circuit layer, a third dielectric layer, a third circuit layer and a fourth dielectric layer sequentially disposed on the bottom surface of the core 61. The second solder ball 65 is disposed on the bottom RDL 64 for external connection purpose.

The semiconductor package structure 4c is similar to the semiconductor package structure 4 shown in FIG. 3, except that the insulation layer 14 and the supporter 16 are omitted. The semiconductor package structure 4c is disposed on and electrically connected to the top RDL 63 of the package substrate 6. For example, the wiring structure 2 is electrically connected to the top RDL 63 through the connecting element 18. The second underfill 54 is disposed between the semiconductor package structure 4c and the package substrate 6, and surrounds the connecting element 18.

The wiring structure 2 in the substrate structure 4c may be provided from the substrate structure 1 shown in FIG. 1. That is, the wiring structure 2 may be tested before attaching the semiconductor die 43 thereon and removing the supporter 16. Accordingly, the wiring structure 2 is known-good, thus the semiconductor device 5 is provided with an improved yield rate.

Figure 7:
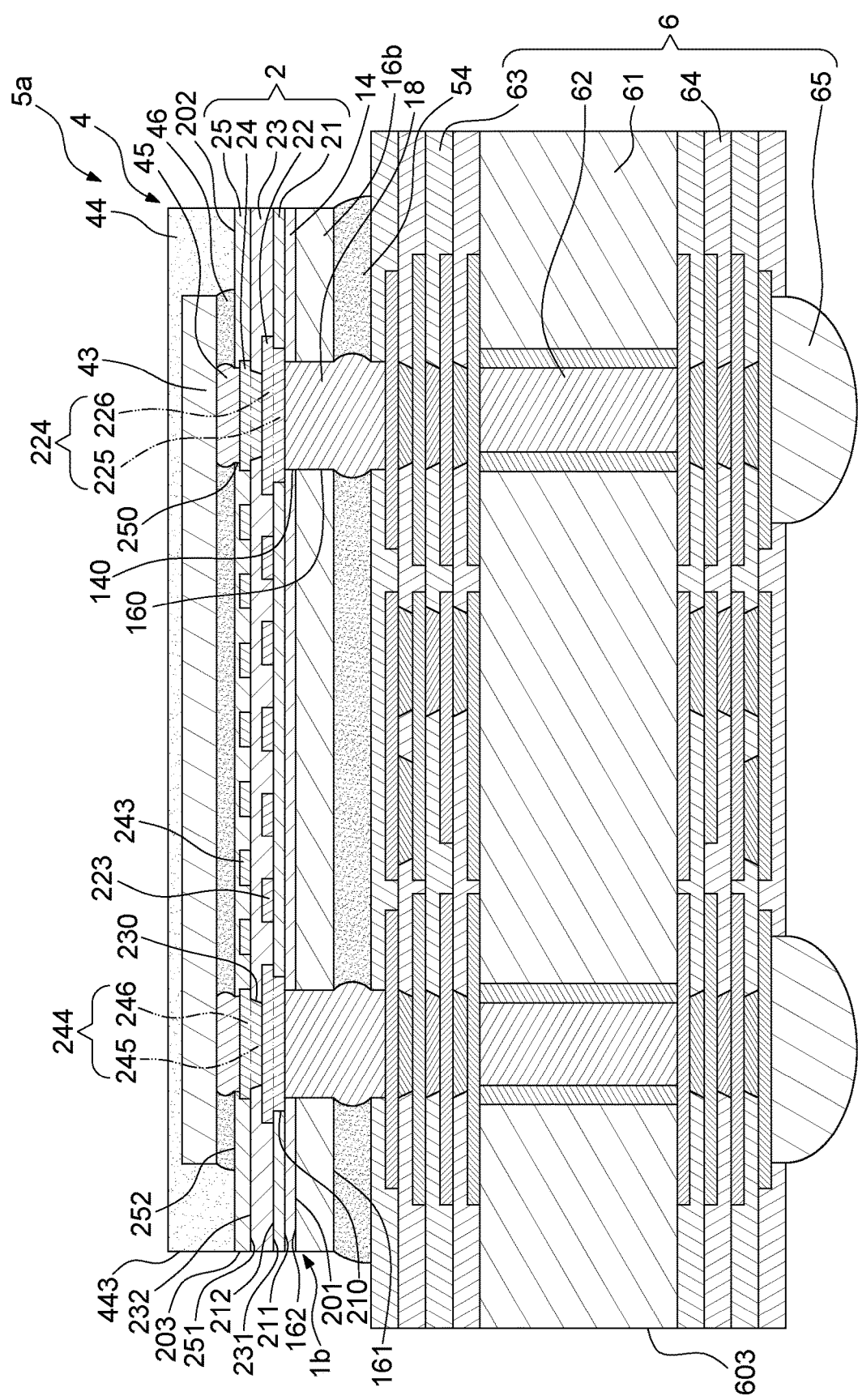
FIG. 7 illustrates a cross sectional view of an example of a semiconductor device according to some embodiments of the present disclosure.

FIG. 7 illustrates a cross sectional view of an example of a semiconductor device 5a according to some embodiments of the present disclosure. The semiconductor device 5a is similar to the semiconductor device 5 shown in FIG. 6, except that the semiconductor package structure 4c is replaced by the semiconductor package structure 4 shown in FIG. 3. That is, the semiconductor package structure 4 includes the supporter 16b and the insulation layer 14.

Figure 8:
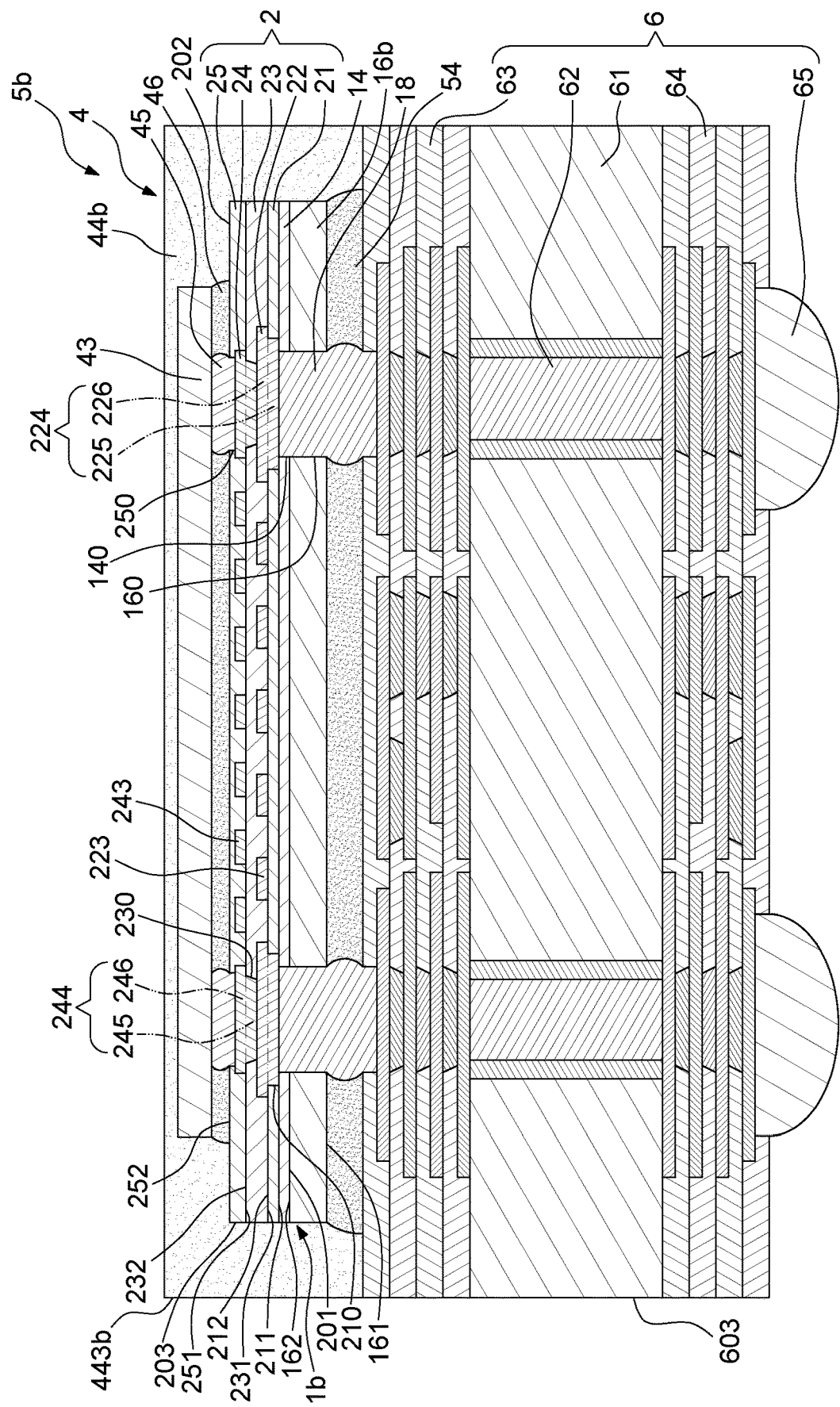
FIG. 8 illustrates a cross sectional view of an example of a semiconductor device according to some embodiments of the present disclosure.

FIG. 8 illustrates a cross sectional view of an example of a semiconductor device 5b according to some embodiments of the present disclosure. The semiconductor device 5b is similar to the semiconductor device 5a shown in FIG. 7, except that the encapsulant 44b further covers the wiring structure 2, the supporter 16 and the top RDL 63 of the package substrate 6. A lateral surface 443b of the encapsulant 44b is substantially coplanar with a lateral surface 603 of the package substrate 6.

FIG. 9 through FIG. 19 illustrate a semiconductor process according to some embodiments of the present disclosure. In some embodiments, the semiconductor process is for testing the wiring structure 2, manufacturing the semiconductor package structure 4c, and/or manufacturing the semiconductor device 5 shown in FIG. 6.

Figure 9:
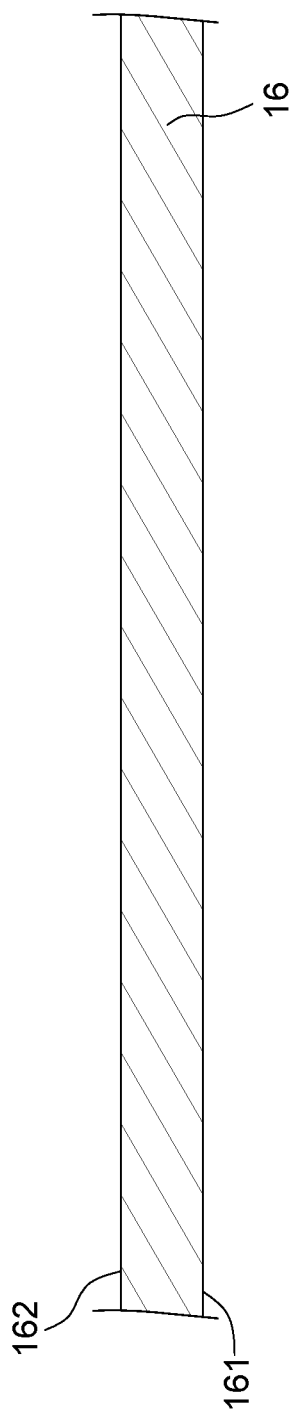
FIG. 9 illustrates one or more stages of an example of a semiconductor process according to some embodiments of the present disclosure.

Referring to FIG. 9, a supporter 16 is provided. The supporter 16 has a first surface 161 and a second surface 162 opposite to the first surface 161. A material of the supporter may be organic (e.g., core, epoxy, compound) or inorganic (e.g., Si, glass, metal).

Figure 10:
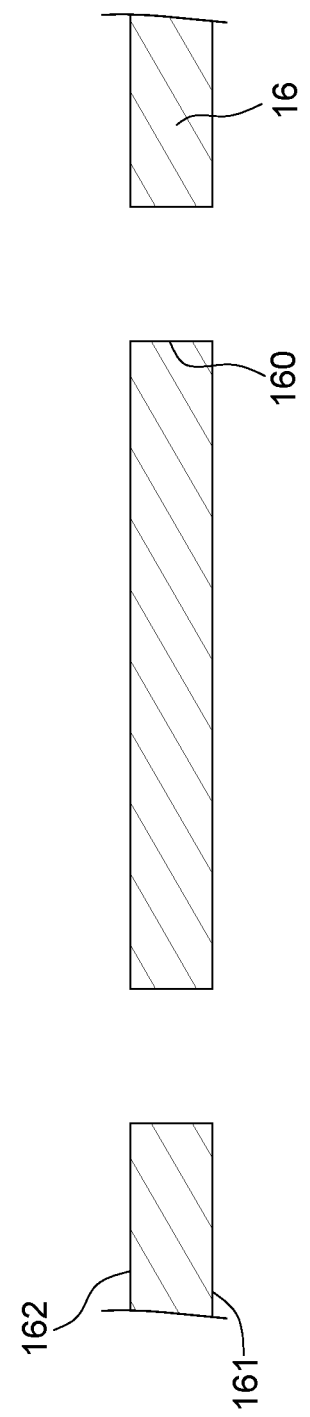
FIG. 10 illustrates one or more stages of an example of a semiconductor process according to some embodiments of the present disclosure.

Referring to FIG. 10, at least one through hole 160 is formed on and extends through the supporter 16. That is, the supporter 16 defines at least one through hole 160.

Figure 11:
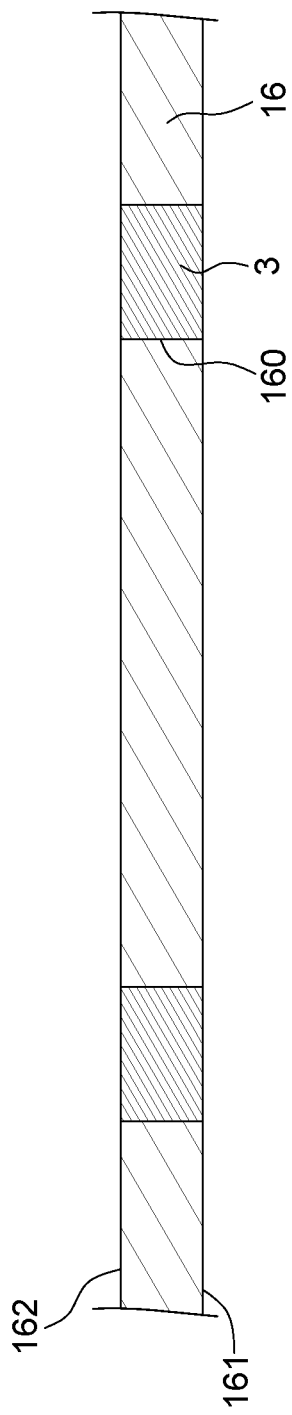
FIG. 11 illustrates one or more stages of an example of a semiconductor process according to some embodiments of the present disclosure.

Referring to FIG. 11, a plugging material 3 is disposed in the through hole 160 of the supporter 16. The plugging material 3 blocks the through hole 160 of the supporter 16. For example, as shown in FIG. 11, the plugging material 3 fills the through hole 160 of the supporter 16. The plugging material 3 may have a first surface 31 and a second surface 32 opposite to the first surface 31. The first surface 31 of the plugging material 3 is substantially coplanar with the first surface 161 of the supporter 16, and the second surface 32 of the plugging material 3 is substantially coplanar with the second surface 162 of the supporter 16. That is, two opposite surfaces (e.g., the first surface 31 and the second surface 32) of the plugging material 3 are respectively coplanar with two opposite surfaces (e.g., the first surface 161 and the second surface 162) of the supporter 16. The material of the plugging material 3 may be a resin, such as epoxy (e.g., PHP-900 IR6 produced by SAN-EI KAGAKU CO., LTD) or other suitable material. Accordingly, the plugging material 3 may easily be removed by dissolving with a solvent (e.g., a solution of potassium manganate(VII) or sodium manganate (VII)) or by laser drilling with a lower power.

Figure 12:
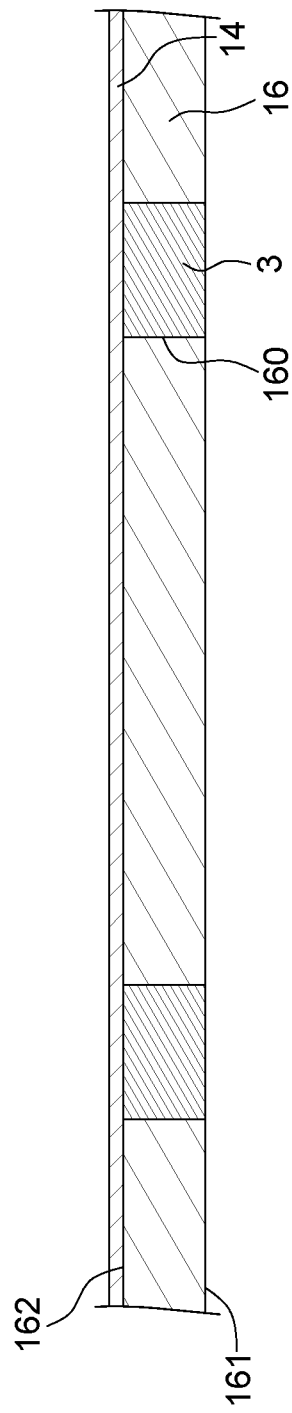
FIG. 12 illustrates one or more stages of an example of a semiconductor process according to some embodiments of the present disclosure.

Referring to FIG. 12, an insulation layer 14 is formed or disposed on the supporter 16 and the plugging material 3. For example, the insulation layer 14 is formed or disposed on the second surface 162 of the supporter 16 and the second surface 32 of the plugging material 3. The insulation layer 14 may be made of a dielectric material, or may be a releasing film.

Referring to FIG. 13, a wiring structure 2 is formed on the supporter 16, such as formed on the insulation layer 14 on the supporter 16. The wiring structure 2 has a first surface 201, a second surface 202 opposite to the first surface 201, and a lateral surface 203 extending between the first surface 201 and the second surface 202. The wiring structure 2 includes at least one dielectric structure (e.g., a first dielectric structure 21, a second dielectric structure 23 and a third dielectric structure 25) and at least one circuit layer (e.g., a first circuit layer 22 and a second circuit layer 24). For example, as shown in FIG. 1, the wiring structure 2 includes a first dielectric structure 21, a first circuit layer 22, a second dielectric structure 23, a second circuit layer 24 and a third dielectric structure 25.

The first dielectric structure 21 has a first surface 211 and a second surface 212 opposite the first surface 211. The first surface 211 of the first dielectric structure 21 may be a portion of the first surface 201 of the wiring structure 2. The first dielectric structure 21 defines at least one through hole 210. The first dielectric structure 21 may include, or be formed from, a cured PID material such as epoxy or polyimide (PI) including photoinitiators.

The first circuit layer 22 is disposed on the second surface 212 of the first dielectric structure 21. The first circuit layer 22 includes a plurality of first conductive traces 223 and at least one first pad portion 224. The first pad portion 224 may include a lower portion 225 and an upper portion 226. The traces 223, the lower portion 225 and the upper portion 226 of the first pad portion 224 may be formed concurrently and integrally by, for example, plating. However, in other embodiments, the traces 223 and the upper portion 226 of the first pad portion 224 may be formed concurrently and integrally, while the lower portion 225 of the first pad portion 224 is separately formed, and a boundary may exist between the lower portion 225 and the upper portion 226 of the first pad portion 224. The lower portion 225 of the first pad portion 224 is disposed in the through hole 210 of the first dielectric structure 21, and is exposed from the first surface 211 of the first dielectric structure 21. That is, a pad portion (e.g., the first pad portion 224) of the circuit layer (e.g., the first circuit layer 22) is exposed from the first surface 201 of the wiring structure 21. The through hole 160 of the supporter 16 corresponds to the exposed pad portion (e.g., the first pad portion 224) of the circuit layer (e.g., the first circuit layer 22). The first circuit layer 22 may be a redistribution layer. A line width/line space (L/S) of the first circuit layer 22 may be less than about 7 μm/about 7 μm (e.g., in a range of about 2 μm/about 2 μm to about 5 μm/about 5 μm).

The second dielectric structure 23 is disposed on and covers the first dielectric structure 21 and the first circuit layer 22. The second dielectric structure 23 has a first surface 231 and a second surface 232 opposite to the first surface 231. For example, the first surface 231 of the second dielectric structure 23 contacts the second surface 212 of the first dielectric structure 21. The second dielectric structure 23 defines at least one through hole 230 to expose the upper portion 226 of the first pad portion 224 of the first circuit layer 22. The second dielectric structure 23 may include, or be formed from, a cured PID material such as epoxy or polyimide (PI) including photoinitiators.

The second circuit layer 24 is disposed on the second surface 232 of the second dielectric structure 23. The second circuit layer 24 includes a plurality of second conductive traces 243 and at least one second pad portion 244. The second pad portion 244 may include a lower portion 245 and an upper portion 246. The traces 243, the lower portion 245 and the upper portion 246 of the second pad portion 244 may be formed concurrently and integrally by, for example, plating. However, in other embodiments, the traces 223 and the upper portion 246 of the second pad portion 244 may be formed concurrently and integrally, while the lower portion 245 of the second pad portion 244 is separately formed, and a boundary may exist between the lower portion 245 and the upper portion 246 of the second pad portion 244. The lower portion 245 of the second pad portion 244 is disposed in the through hole 230 of the second dielectric structure 23 to contact the first pad portion 224 of the first circuit layer 22, such as the upper portion 226 of the first pad portion 224 of the first circuit layer 22. The second circuit layer 24 may be a redistribution layer. A line width/line space (L/S) of the second circuit layer 24 may be less than about 7 μm/about 7 μm (e.g., in a range of about 2 μm/about 2 μm to about 5 μm/about 5 μm).

The third dielectric structure 25 is disposed on and covers the second dielectric structure 23 and the second circuit layer 24. The third dielectric structure 25 has a first surface 251 and a second surface 252 opposite to the first surface 251. For example, the first surface 251 of the third dielectric structure 25 contacts the second surface 232 of the second dielectric structure 23. The second surface 252 of the third dielectric structure 25 may be a portion of the second surface 202 of the wiring structure 2. The third dielectric structure 25 defines at least one through hole 250 to expose the upper portion 246 of the second pad portion 244 of the second circuit layer 24. The third dielectric structure 25 may include, or be formed from, a cured PID material such as epoxy or polyimide (PI) including photoinitiators.

Referring to FIG. 14, at least a portion of the plugging material 3 is removed to expose the pad portion (e.g., the first pad portion 224) of the circuit layer (e.g., the first circuit layer 22). In some embodiments, the pugging material 3 may be made of a resin, and may be removed by dissolving with a solvent (e.g., an alkali solution) or laser drilling. As shown in FIG. 14, the entire plugging material 3 may be removed.

Figure 15:
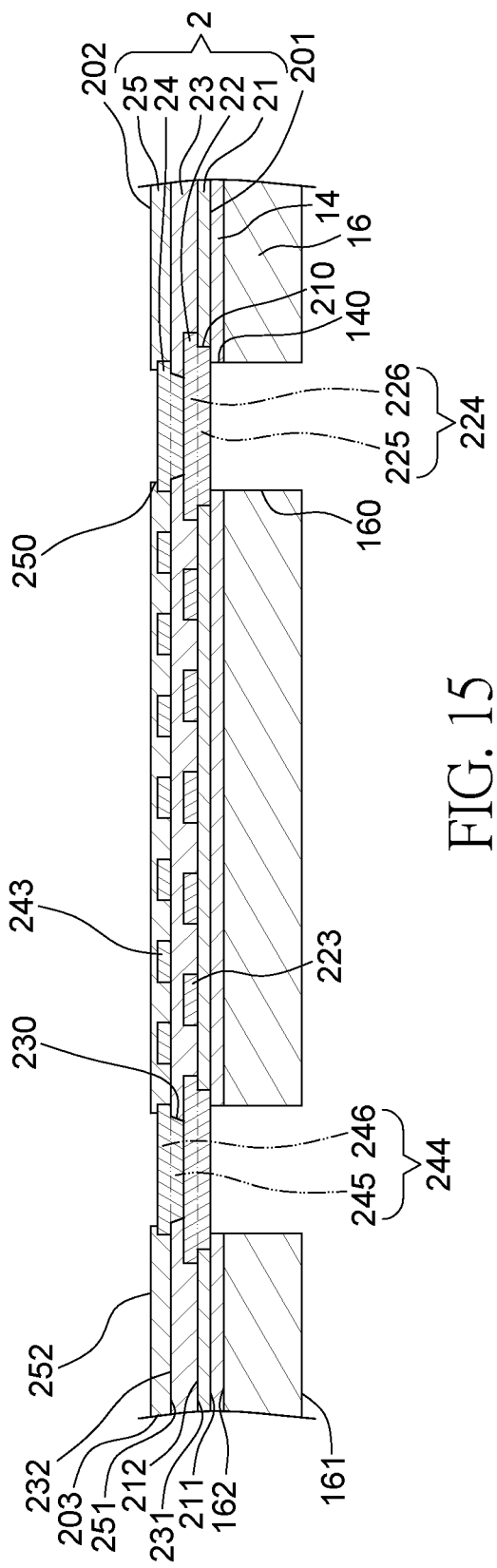
FIG. 15 illustrates one or more stages of an example of a semiconductor process according to some embodiments of the present disclosure.

Referring to FIG. 15, a portion of the insulation layer 14 is then removed. For example, the portion of the insulation layer 14 may be removed by laser drilling, thus form a through hole 140 to expose the pad portion (e.g., the first pad portion 224) of the circuit layer (e.g., the first circuit layer 22). Since the insulation layer 14 is made of a dielectric material, or is a releasing film, the power of the laser drilling may be relatively low and may not damage the wiring structure 2.

In other embodiments, the plugging material 3 may be partially removed. For example, as shown in FIG. 4, a portion of the plugging material 3 may be removed, such that the plugging material 3c defines a through hole 30 to expose the pad portion (e.g., the first pad portion 224) of the circuit layer (e.g., the first circuit layer 22). Besides, the portion of the plugging material 3 and the portion of the insulation layer 14 can be removed in the same laser removing process. Accordingly, as shown in FIG. 4, the sidewall of the through hole 30 of the plugging material 3c is continuous with the sidewall of the through hole 140 of the insulation layer 14.

Referring to FIG. 16, an electrical property of the wiring structure 2 is tested, such as testing for electrical connection defect (e.g., open circuit) of the wiring structure 2. In one embodiment, an open/short (O/S) testing is conducted. For example, as shown in FIG. 16, the electrical property of the wiring structure 2 is tested with a first probe 85 and a second probe 86. The first probe 85 contacts a lower portion (e.g., the lower portion 225) of the exposed pad portion (e.g., the first pad portion 224) of the circuit layer (e.g., the first circuit layer 22). The second probe 86 is electrically connected to an upper portion (e.g., the upper portion 226) of the exposed pad portion (e.g., the first pad portion 224) of the circuit layer (e.g., the first circuit layer 22). As shown in FIG. 16, the first probe 85 extends through the through hole 160 of the supporter 16 and the through hole 140 of the insulation layer 14 to contact the lower portion 225 of the first pad portion 224 of the first circuit layer 22. The second probe 86 extends through the through hole 250 of the third dielectric structure 25 to contact the upper portion 246 of the second pad portion 244 of the second circuit layer 24, and is thus electrically connected to the lower portion 225 of the first pad portion 224 of the first circuit layer 22 through the lower portion 245 of the second pad portion 244 of the second circuit layer 24 and the upper portion 226 of the first pad portion 224 of the first circuit layer 22. In one embodiment, if an electrical current from the first probe 85 to the second probe 86 is greater than a predetermined value, the electrical connection between the first pad portion 224 of the first circuit layer 22 and the second pad portion 244 of the second circuit layer 24 is judged as good or qualified. That is, the connection between the first pad portion 224 of the first circuit layer 22 and the second pad portion 244 of the second circuit layer 24 is not an open circuit.

Figure 17:
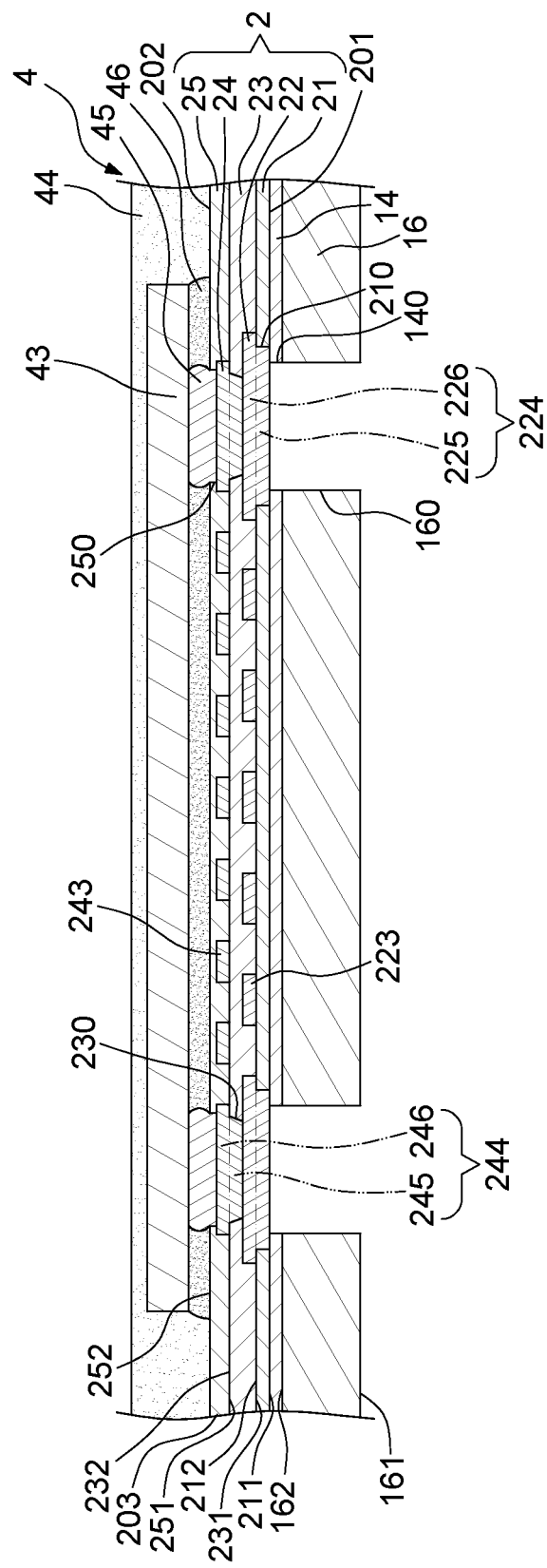
FIG. 17 illustrates one or more stages of an example of a semiconductor process according to some embodiments of the present disclosure.

Since the testing stage can be conducted to the wiring structure 2 before attaching a semiconductor die 43 (as shown in FIG. 17) and/or removing the supporter 16, it is assured that the wiring structure 2 is known-good before attaching the semiconductor die 43 thereto. That is, the wiring structure 2 can be tested in process.

Referring to FIG. 17, a semiconductor die 43 is attached and electrically connected to the second surface 202 of the wiring structure 2. For example, the semiconductor die 43 is electrically connected to the upper portion 246 of the second pad portion 244 of second circuit layer 24 through a first solder ball 45 disposed therebetween. As shown in FIG. 17, the semiconductor die 43 is attached to the second surface 202 of the wiring structure 2 by flip-chip bonding. Then, an underfill 46 is disposed between the semiconductor die 43 and the second surface 202 of the wiring structure 2, and surrounds the first solder ball 45. The encapsulant 44 covers the semiconductor die 43 and the second surface 202 of the wiring structure 2. For example, the encapsulant 44 is disposed on the second surface 202 of the wiring structure 2 and encapsulates the semiconductor die 43. The encapsulant 44 may be made of a molding compound with or without fillers.

Figure 18:
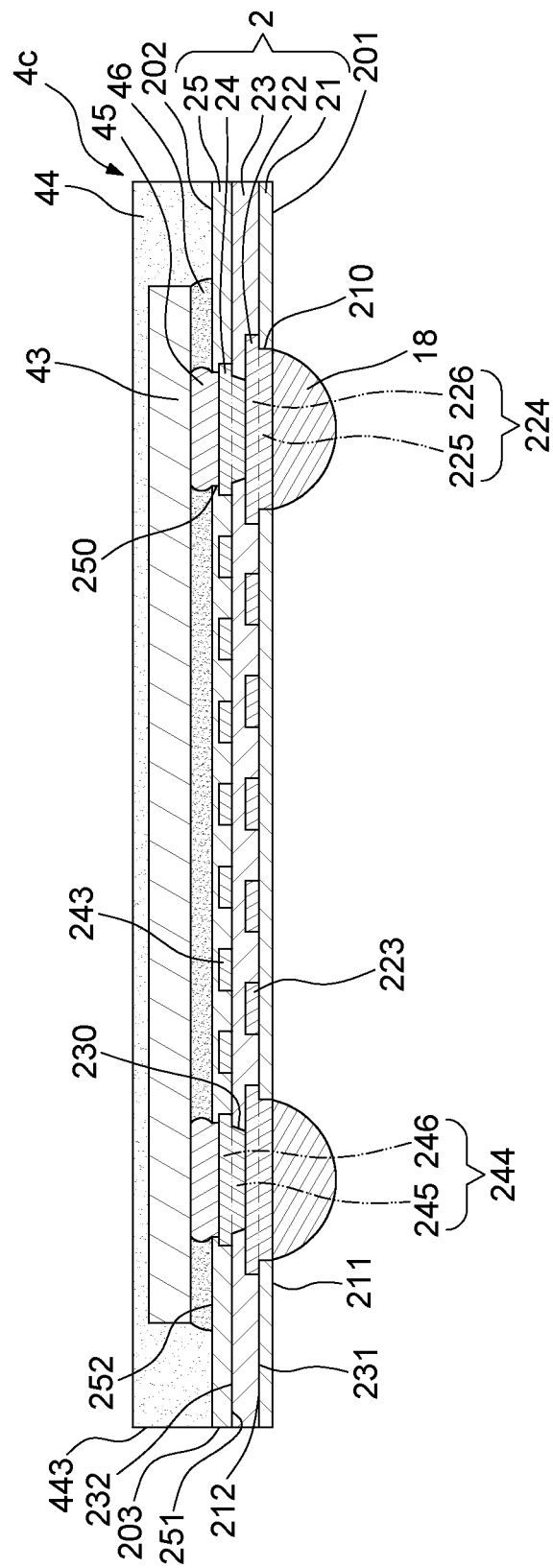
FIG. 18 illustrates one or more stages of an example of a semiconductor process according to some embodiments of the present disclosure.

Referring to FIG. 18, the supporter 16 and the insulation layer 14 are removed from the wiring structure 2. The supporter 16 may be reused (as shown in FIG. 16). Then, a connecting element 18 is formed on the exposed pad portion (e.g., the first pad portion 224) of the circuit layer (e.g., the first circuit layer 22). Then, a singulation process is conducted to the wiring structure 2 and the encapsulant 44, thus forming a semiconductor package 4c as shown in FIG. 18. A lateral surface 443 of the encapsulant 44 may thus be substantially coplanar with a lateral surface 203 of the wiring structure 2.

Figure 19:
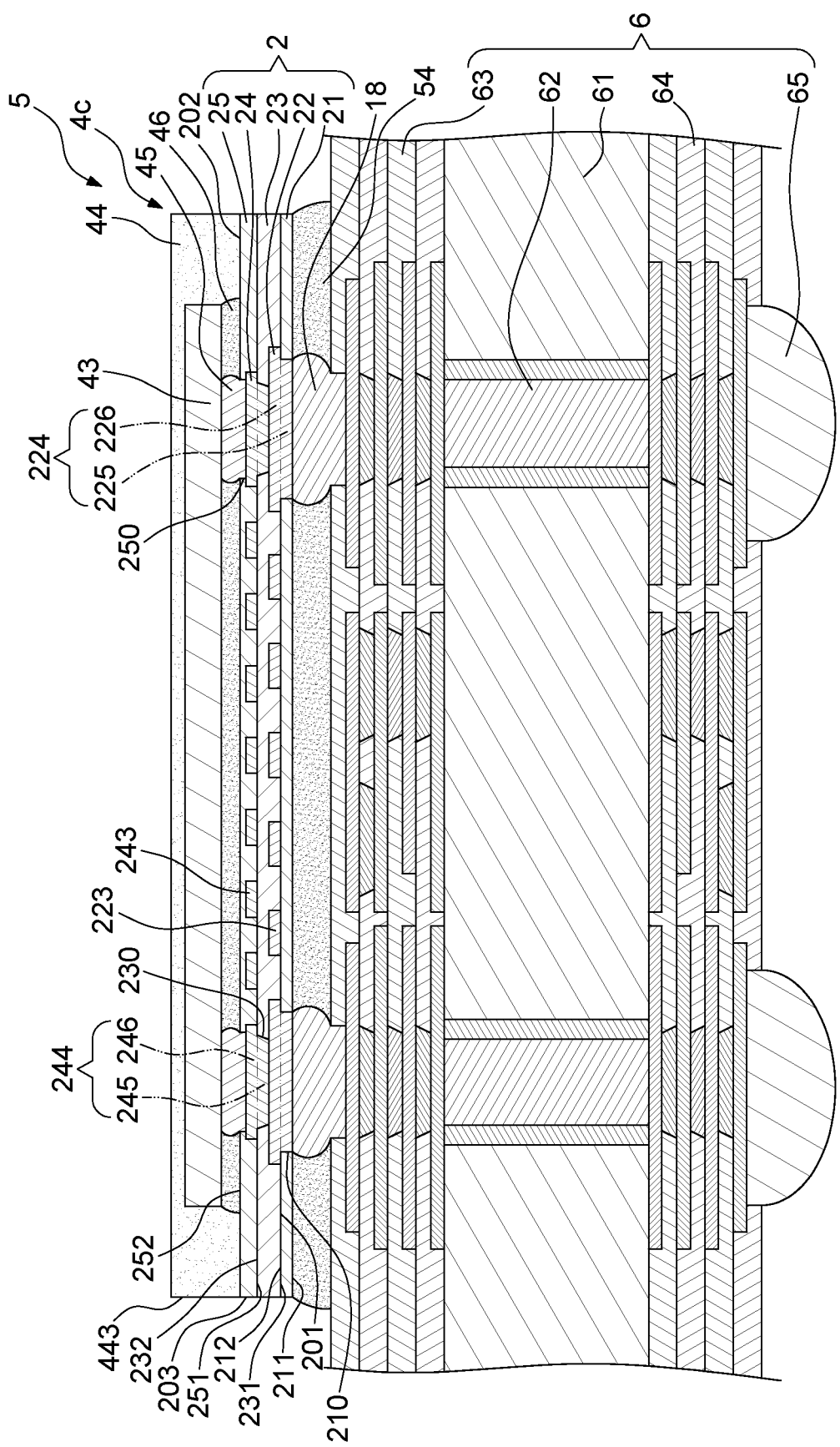
FIG. 19 illustrates one or more stages of an example of a semiconductor process according to some embodiments of the present disclosure.

Referring to FIG. 19, a package substrate 6 is provided. The package substrate 6 includes a core 61, a conductive via 62, a top redistribution layer (RDL) 63, a bottom RDL 64, and a second solder ball 65. The conductive via 62 extends through the core 61. The conductive via 62 may include a conductive material surrounded by an insulation material. The top RDL 63 and the bottom RDL 64 are respectively disposed on two opposite surfaces of the core 61, and are electrically connected to each other through the conductive via 62. The top RDL 63 and the bottom RDL 64 may respectively include one or more redistribution layers. For example, the top RDL 63 may include a first dielectric layer, a first circuit layer, a second dielectric layer, a second circuit layer, a third dielectric layer, a third circuit layer and a fourth dielectric layer sequentially disposed on the top surface of the core 61. Each of the first circuit layer, the second circuit layer and the third circuit layer may include at least one trace and at least one via, and the first circuit layer, the second circuit layer and the third circuit layer may be electrically connected to each other. Similarly, the bottom RDL 64 may also include a first dielectric layer, a first circuit layer, a second dielectric layer, a second circuit layer, a third dielectric layer, a third circuit layer and a fourth dielectric layer sequentially disposed on the bottom surface of the core 61. The second solder ball 65 is disposed on the bottom RDL 64 for external connection purpose.

Then, the semiconductor package structure 4c is disposed on and electrically connected to the top RDL 63 of the package substrate 6. For example, the wiring structure 2 is electrically connected to the top RDL 63 through the connecting element 18. The second underfill 54 is disposed between the semiconductor package structure 4c and the package substrate 6, and surrounds the connecting element 18. Then, a singulation process may be conducted to the package substrate 6, thus forming the semiconductor device 5 as shown in FIG. 6.

Figure 20:
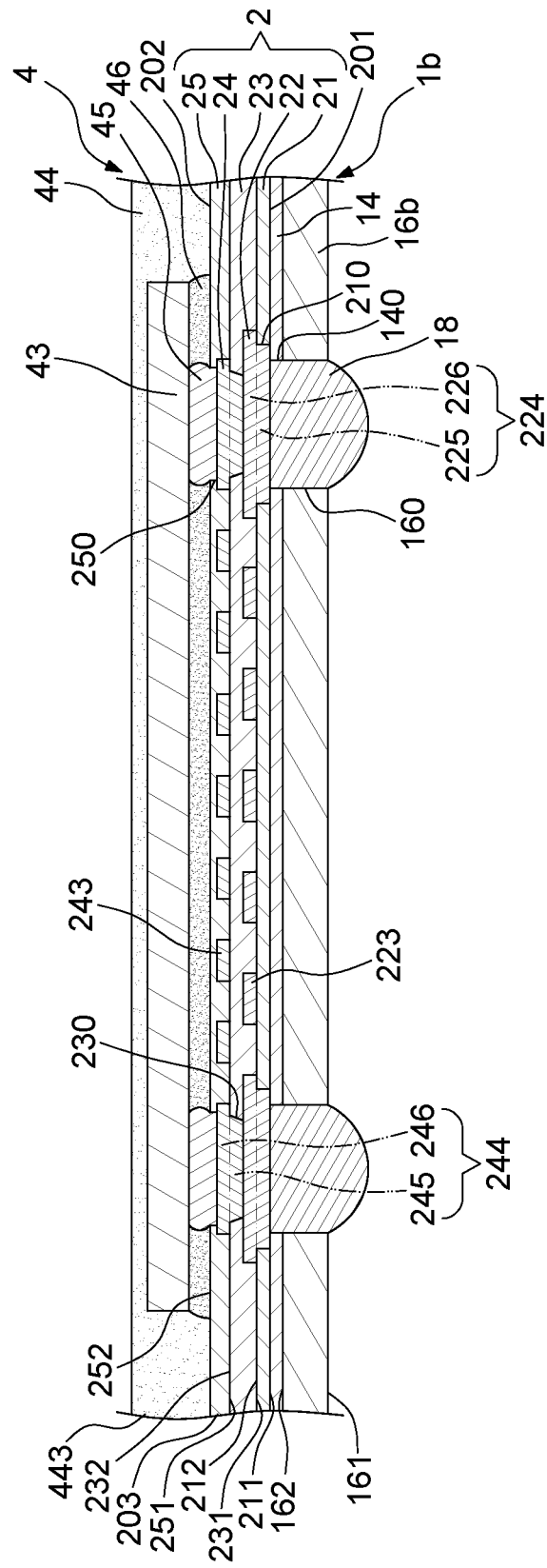
FIG. 20 illustrates one or more stages of an example of a semiconductor process according to some embodiments of the present disclosure.

FIG. 20 illustrates a semiconductor process according to some embodiments of the present disclosure. In some embodiments, the semiconductor process is for testing the wiring structure 2, manufacturing the semiconductor package structure 4 shown in FIG. 3, and/or manufacturing the semiconductor device 5a shown in FIG. 7. The initial stages of the illustrated process are the same as, or similar to, the stages illustrated in FIG. 9 through FIG. 17. FIG. 20 depicts a stage subsequent to that depicted in FIG. 17.

Referring to FIG. 20, the supporter 16 is then thinned to form the supporter 16b. That is, a thickness of the supporter 16 may be reduced by, for example, grinding, to form the supporter 16b as shown in FIG. 20. Then, a connecting element 18 is formed in the through hole 160 of the supporter 16b and in the through hole 140 of the insulation layer 14 to contact the pad portion (e.g., the first pad portion 224) of the circuit layer (e.g., the first circuit layer 22). Then, a singulation process is conducted to the wiring structure 2 and the encapsulant 44, thus forming a semiconductor package 4 as shown in FIG. 13.

Then, similar to the stage shown in FIG. 19, the semiconductor package structure 4 is disposed on and electrically connected to a top RDL 63 of a package substrate 6 through the connecting element 18. Then, a singulation process may be conducted to the package substrate 6, thus forming the semiconductor device 5a as shown in FIG. 7.

In other embodiments, the insulation layer 14, which is formed or disposed on the supporter 16 as shown in FIG. 12, may be omitted. The wiring structure 2 formed in the stage shown in FIG. 13 may be directly formed on the supporter 16. Accordingly, with the subsequent stages as shown in FIGS. 14 to 17 and 20, a semiconductor package structure 4b as shown in FIG. 5 may be formed.

Figure 21:
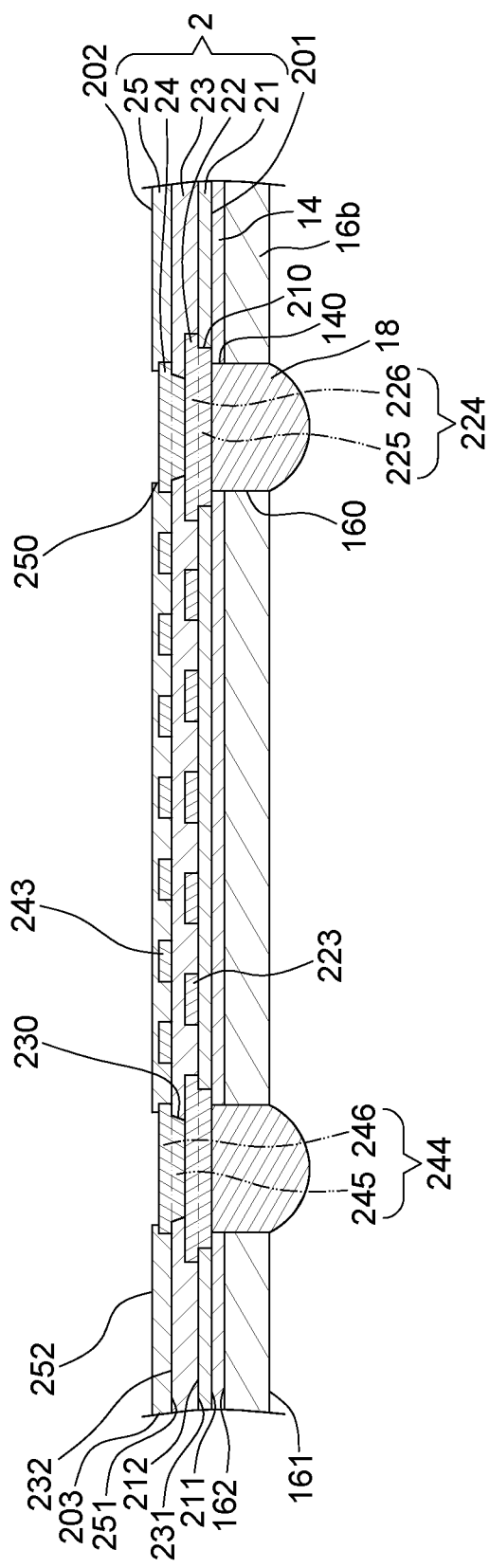
FIG. 21 illustrates one or more stages of an example of a semiconductor process according to some embodiments of the present disclosure.

FIG. 21 illustrates a semiconductor process according to some embodiments of the present disclosure. In some embodiments, the semiconductor process is for testing the wiring structure 2, and/or manufacturing the semiconductor device 5b shown in FIG. 8. The initial stages of the illustrated process are the same as, or similar to, the stages illustrated in FIG. 9 through FIG. 16. FIG. 21 depicts a stage subsequent to that depicted in FIG. 16.

Referring to FIG. 21, the supporter 16 is then thinned to form the supporter 16b. That is, a thickness of the supporter 16 may be reduced by, for example, grinding, to form the supporter 16b as shown in FIG. 21. Then, a connecting element 18 is formed in the through hole of the supporter 16b to contact the pad portion (e.g., the first pad portion 244) of the circuit layer (e.g., the first circuit layer 24). Then, a singulation process is conducted to the wiring structure 2, thus forming a substrate structure 1b of the semiconductor package structure 4 as shown in FIG. 3.

Figure 22:
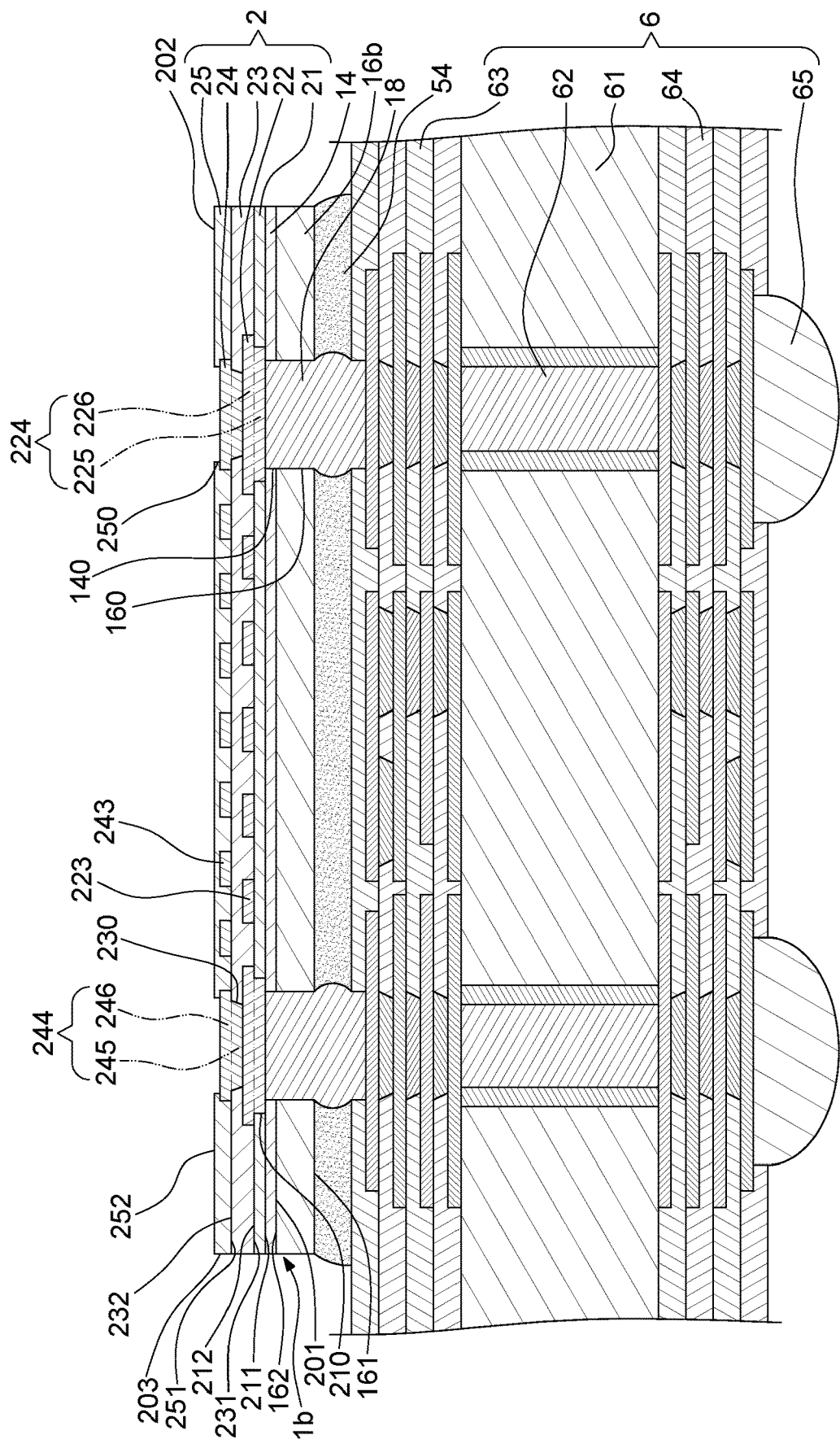
FIG. 22 illustrates one or more stages of an example of a semiconductor process according to some embodiments of the present disclosure.

Referring to FIG. 22, a package substrate 6 is provided. The package substrate 6 is similar to that shown in and described related to FIG. 19, thus is not described redundantly here. Then, the substrate structure 1b is disposed on and electrically connected to the top RDL 63 of the package substrate 6 through the connecting element 18.

Figure 23:
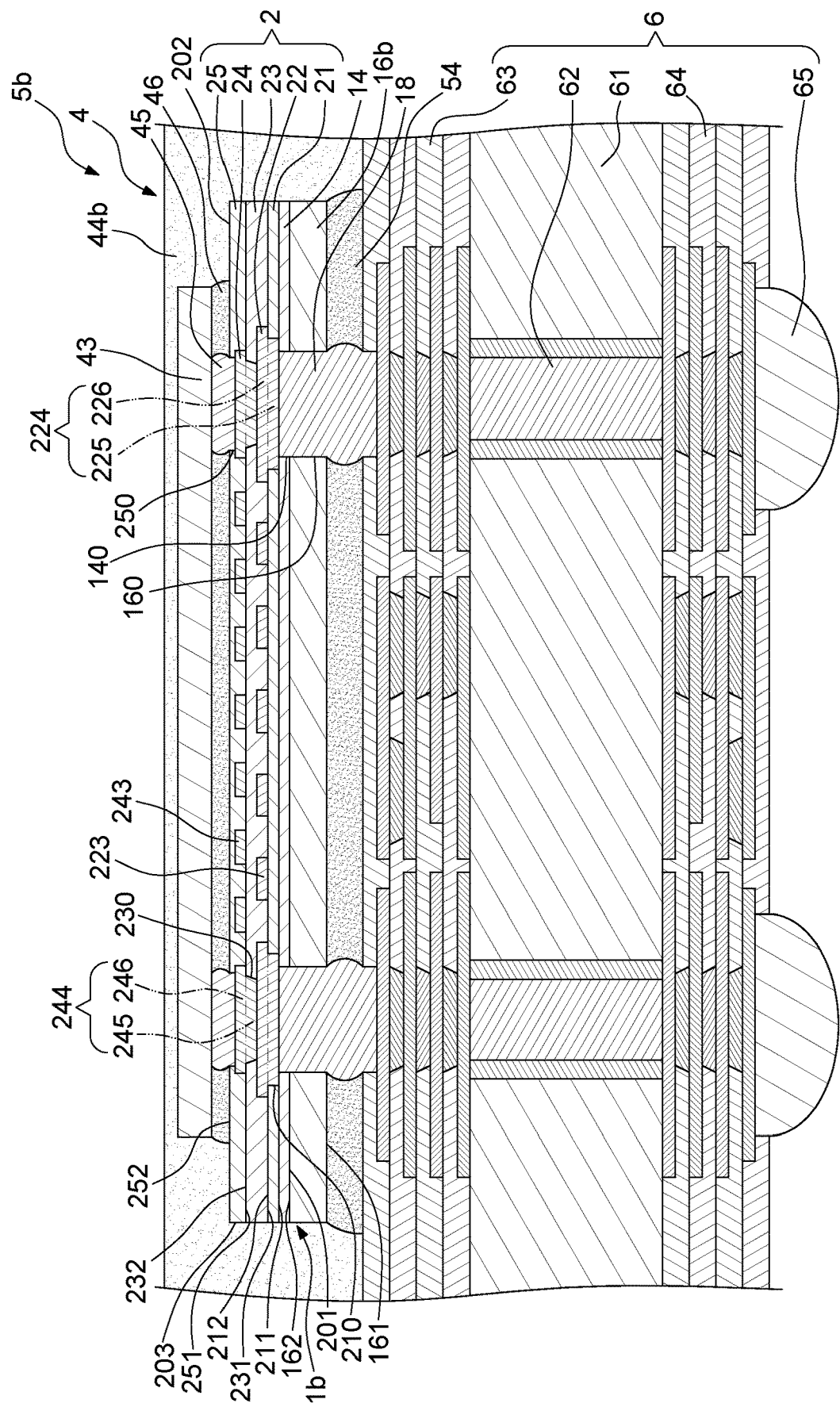
FIG. 23 illustrates one or more stages of an example of a semiconductor process according to some embodiments of the present disclosure.

Referring to FIG. 23, a semiconductor die 43 is then attached and electrically connected to the second surface 202 of the wiring structure 2. Then, an underfill 46 is disposed between the semiconductor die 43 and the second surface 202 of the wiring structure 2, and surrounds the first solder ball 45. An encapsulant 44b is then formed on the package substrate 6 to cover the semiconductor die 43 and the substrate structure 1b. Then, a singulation process may be conducted to the package substrate 6 and the encapsulant 44b, thus forming the semiconductor device 5b as shown in FIG. 8. A lateral surface 443b may thus be substantially coplanar with a lateral surface 603 of the package substrate 6.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
a wiring structure including a first dielectric structure, a first circuit layer, a second dielectric structure and a second circuit layer, wherein the first circuit layer is disposed on the first dielectric structure, the second dielectric structure covers the first dielectric structure and the first circuit layer, a pad portion of the first circuit layer is exposed from the first dielectric structure, and the second circuit layer protrudes from the second dielectric structure;
a supporter disposed adjacent to the first dielectric structure of the wiring structure, and defining at least one through hole corresponding to the exposed pad portion of the first circuit layer; and
an insulation layer disposed between the wiring structure and the supporter.

2. The substrate structure of claim 1, wherein the first dielectric structure has a first surface and a second surface, and defines at least one through hole; the first circuit layer is disposed on the second surface of the first dielectric structure, and includes a plurality of first conductive traces and at least one first pad portion, a lower portion of the first pad portion is disposed in the through hole of the first dielectric structure, and is exposed from the first surface of the first dielectric structure; and the second dielectric structure defines at least one through hole to expose an upper portion of the first pad portion of the first circuit layer.

3. The substrate structure of claim 2, wherein the second circuit layer is disposed on the second dielectric structure, and includes a plurality of second conductive traces and at least one second pad portion, a lower portion of the second pad portion is disposed in the through hole of the second dielectric structure to contact the first pad portion of the first circuit layer; and
the wiring structure further comprises:
a third dielectric structure covering the second dielectric structure and the second circuit layer, and defining at least one through hole to expose an upper portion of the second pad portion of the second circuit layer.

4. The substrate structure of claim 1, wherein the insulation layer defines a through hole corresponding to the through hole of the supporter to expose the pad portion of the circuit layer.

5. The substrate structure of claim 4, wherein the insulation layer is a releasing film.

6. The substrate structure of claim 5, wherein the plugging material defines a through hole to expose the pad portion of the circuit layer.

7. The substrate structure of claim 6, wherein a sidewall of the through hole of the plugging material is continuous with a sidewall of the through hole of the insulation layer.

8. The substrate structure of claim 6, further comprising:
a connecting element disposed in the through hole of the plugging material and contacts the pad portion of the circuit layer.

9. The substrate structure of claim 8, wherein the connecting element is a solder ball, a copper pillar, or a copper pillar having a solder cap.

10. The substrate structure of claim 4, wherein a sidewall of the through hole of the insulation layer is continuous with a sidewall of the through hole of the supporter.

11. The substrate structure of claim 1, further comprising:
a plugging material disposed in the through hole of the supporter.

12. The substrate structure of claim 11, wherein two opposite surfaces of the plugging material are respectively substantially coplanar with two opposite surfaces of the supporter.

13. The substrate structure of claim 1, wherein a Young's modulus of the supporter is about 70 Gpa to about 200 Gpa.

14. The substrate structure of claim 1, wherein the through hole of the supporter is substantially in a trapezoid shape.

\* \* \* \* \*